US012652946B2

(12) United States Patent
Cho

(10) Patent No.: US 12,652,946 B2
(45) Date of Patent: Jun. 9, 2026

(54) DISPLAY DEVICE

(71) Applicant: Samsung Display Co., Ltd., Yongin-si (KR)

(72) Inventor: Youngje Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 539 days.

(21) Appl. No.: 18/114,504

(22) Filed: Feb. 27, 2023

(65) Prior Publication Data

US 2023/0354689 A1 Nov. 2, 2023

(30) Foreign Application Priority Data

Apr. 29, 2022 (KR) ........................ 10-2022-0053541

(51) Int. Cl.
| | |
|---|---|
| *H10K 77/10* | (2023.01) |
| *H10K 59/121* | (2023.01) |
| *H10K 59/38* | (2023.01) |
| *H10K 59/40* | (2023.01) |
| *H10K 59/80* | (2023.01) |
| *H10K 102/00* | (2023.01) |

(52) U.S. Cl.
CPC ....... *H10K 77/111* (2023.02); *H10K 59/1213* (2023.02); *H10K 59/38* (2023.02); *H10K 59/40* (2023.02); *H10K 59/873* (2023.02); *H10K 2102/311* (2023.02)

(58) Field of Classification Search
CPC .. H10K 77/111; H10K 59/1213; H10K 59/38; H10K 59/40; H10K 59/873; H10K 2102/311; H10K 59/124; H10K 50/8445;

H10K 50/841; H10K 59/00; H10K 50/844; G06F 1/1624; G06F 1/1637; G06F 1/1652; G09F 9/301; H10D 30/6755

See application file for complete search history.

(56) References Cited

U.S. PATENT DOCUMENTS

| | | | |
|---|---|---|---|
| 10,921,857 B2 | 2/2021 | Kim et al. | |
| 11,177,335 B2 | 11/2021 | Park et al. | |
| 2017/0005149 A1 * | 1/2017 | Park ................... | H10K 59/1213 |
| 2018/0366586 A1 * | 12/2018 | Son ........................ | H10D 86/60 |
| 2020/0273917 A1 * | 8/2020 | Wang ..................... | H10K 59/38 |
| 2020/0395569 A1 * | 12/2020 | Song ..................... | G06F 1/1616 |
| 2021/0165460 A1 * | 6/2021 | Kim ..................... | H10K 77/111 |
| 2022/0124920 A1 * | 4/2022 | He ......................... | G06F 1/1652 |
| 2022/0208880 A1 * | 6/2022 | Kim ..................... | H10K 50/858 |

(Continued)

FOREIGN PATENT DOCUMENTS

| | | | | |
|---|---|---|---|---|
| CN | 110047878 A | * | 7/2019 | ............. H10K 59/50 |
| CN | 108766979 B | * | 9/2020 | ........... H10K 59/131 |

(Continued)

*Primary Examiner* — Chad M Dicke
*Assistant Examiner* — Gary Abel
(74) *Attorney, Agent, or Firm* — CANTOR COLBURN LLP

(57) ABSTRACT

A display device includes a display module including a plurality of pixel regions and a boundary region. The display module includes a plurality of inorganic layers, in which an opening corresponding to the boundary region is defined, an inorganic pattern disposed in the opening and covering a region exposed by the opening, and an organic layer disposed in the opening and contacting the inorganic pattern and an uppermost one of the inorganic layers.

20 Claims, 15 Drawing Sheets

(56)     References Cited

U.S. PATENT DOCUMENTS

| | | | | |
|---|---|---|---|---|
| 2023/0178569 A1* | 6/2023 | Shima | ................. | H10D 86/425 |
| | | | | 257/43 |
| 2023/0200161 A1* | 6/2023 | Jeon | ..................... | H01L 25/105 |
| | | | | 257/40 |
| 2025/0268048 A1* | 8/2025 | Kato | ..................... | H10K 59/35 |

FOREIGN PATENT DOCUMENTS

| | | | | |
|---|---|---|---|---|
| KR | 1020190055868 A | 5/2019 | | |
| KR | 1020200114111 A | 10/2020 | | |
| KR | 1020210041665 A | 4/2021 | | |
| KR | 102818639 B1 * | 6/2025 | ......... | H10K 59/8731 |

* cited by examiner

FIG. 4C

DISPLAY DEVICE

This application claims priority to Korean Patent Application No. 10-2022-0053541, filed on Apr. 29, 2022, and all the benefits accruing therefrom under 35 U.S.C. § 119, the content of which in its entirety is herein incorporated by reference.

BACKGROUND

1. Field

The disclosure relates to a display device, and in particular, to a flexible display device.

2. Description of the Related Art

Electronic devices, such as smart phones, tablets, laptop computers, car navigation systems, and smart television sets, are being developed. The electronic device includes a display device that is used to provide information to a user.

To provide a better user experience/interface ("UX/UI") environment to the user, various types of display devices are being developed. In particular, a flexible display device is being actively developed.

SUMMARY

An embodiment of the inventive concept provides a display panel with improved impact-resistant and moisture-resistant characteristics.

In an embodiment of the inventive concept, a display device may include a display module including a plurality of pixel regions and a boundary region. The display module may include a base layer overlapped with the plurality of pixel regions and the boundary region, a plurality of inorganic layers which are disposed on the base layer and in which an opening is defined at a position corresponding to the boundary region, an inorganic pattern disposed in the opening and covering a region of the base layer exposed by the opening, an organic layer disposed on the plurality of inorganic layers, a light-emitting element disposed on the organic layer and in each of the plurality of pixel regions, and a transistor disposed between the base layer and the organic layer and electrically connected to the light-emitting element. The organic layer may be disposed in the opening, contact the inorganic pattern, and contact an outermost inorganic layer of the plurality of inorganic layers farthest from the base layer.

In an embodiment, a groove is defined in the base layer, the groove is defined corresponding to the boundary region and is extended from the opening.

In an embodiment, the inorganic pattern may be further disposed in the groove.

In an embodiment, the base layer may include a first synthetic resin layer, a barrier inorganic layer disposed on the first synthetic resin layer, and a second synthetic resin layer disposed on the barrier inorganic layer, and the groove may be defined in the second synthetic resin layer.

In an embodiment, the inorganic pattern may contact side surfaces of the plurality of inorganic layers defining the opening.

In an embodiment, the inorganic pattern may be further disposed on a region of a top surface of the outermost inorganic layer of the plurality of inorganic layers.

In an embodiment, the display device may further include a sub-inorganic pattern, which is disposed on a top surface of the outermost inorganic layer of the plurality of inorganic layers and is spaced apart from the inorganic pattern.

In an embodiment, the sub-inorganic pattern may be covered with the organic layer.

In an embodiment, the display device may further include a supporting member disposed below the display module.

In an embodiment, the supporting member may include a matrix layer and a plurality of supporting sticks, which are combined with the matrix layer, are extended in a first direction, and are arranged in a second direction crossing the first direction.

In an embodiment, the display device may further include a window disposed on the display module and a window protection layer disposed on the window.

In an embodiment, the display module may further include a thin encapsulation layer covering the light-emitting element, an input sensor disposed on the thin encapsulation layer, and a color filter disposed on the input sensor and overlapped with the light-emitting element.

In an embodiment, the transistor may include a silicon transistor including a silicon semiconductor pattern and an oxide transistor including an oxide semiconductor pattern. The silicon semiconductor pattern and the oxide semiconductor pattern may be respectively disposed on different ones of the plurality of inorganic layers.

In an embodiment, the display module may be rollable by a roller.

In an embodiment, each of the plurality of pixel regions may be enclosed by the boundary region.

In an embodiment of the inventive concept, a display device may include a display module including a plurality of pixel regions and a boundary region. The display module may include a base layer overlapped with the plurality of pixel regions and the boundary region, a plurality of inorganic layers which are disposed on the base layer and in which an opening is defined at a position corresponding to the boundary region, an inorganic pattern disposed in the opening and covering a region of the base layer exposed by the opening, an organic pattern disposed in the opening and on the inorganic pattern, contacting the inorganic pattern, an organic layer disposed on the plurality of inorganic layers and contacting an outermost inorganic layer of the plurality of inorganic layers farthest from the base layer, a light-emitting element disposed on the organic layer and in each of the plurality of pixel regions, and a transistor disposed between the base layer and the organic layer and electrically connected to the light-emitting element.

In an embodiment of the inventive concept, a display device may include a display module including a plurality of pixel regions and a boundary region. The display module may include a base layer overlapped with the plurality of pixel regions and the boundary region, a plurality of inorganic layers which are disposed on the base layer and in which an opening is defined at a position corresponding to the boundary region, an organic pattern disposed in the opening, an inorganic pattern disposed on the organic pattern, contacting an outermost inorganic layer of the plurality of inorganic layers farthest from the base layer and sealing the organic pattern, an organic layer disposed on the plurality of inorganic layers and contacting the inorganic pattern and the outermost inorganic layer, a light-emitting element disposed on the organic layer and in each of the plurality of pixel regions, and a transistor disposed between the base layer and the organic layer and electrically connected to the light-emitting element.

In an embodiment, the base layer may include a groove, which is defined at a position corresponding to the boundary region and is extended from the opening.

In an embodiment, the organic pattern may be further disposed in the groove.

In an embodiment, the base layer may include a first organic layer, a barrier inorganic layer disposed on the first organic layer, and a second organic layer disposed on the barrier inorganic layer, and the groove may be defined in the second organic layer.

In an embodiment, the display device may further include a supporting member disposed below the display module.

In an embodiment, the supporting member may include a matrix layer and a plurality of supporting sticks, which are combined with the matrix layer, are extended in a first direction, and are arranged in a second direction crossing the first direction.

In an embodiment, the display module may be rollable by a roller.

BRIEF DESCRIPTION OF THE DRAWINGS

Embodiments will be more clearly understood from the following brief description taken in conjunction with the accompanying drawings. The accompanying drawings represent non-limiting, embodiments as described herein.

FIGS. 4B to 4D are plan views, each of which illustrates an embodiment of a display region of a display panel according to the inventive concept.

Figure 1A:
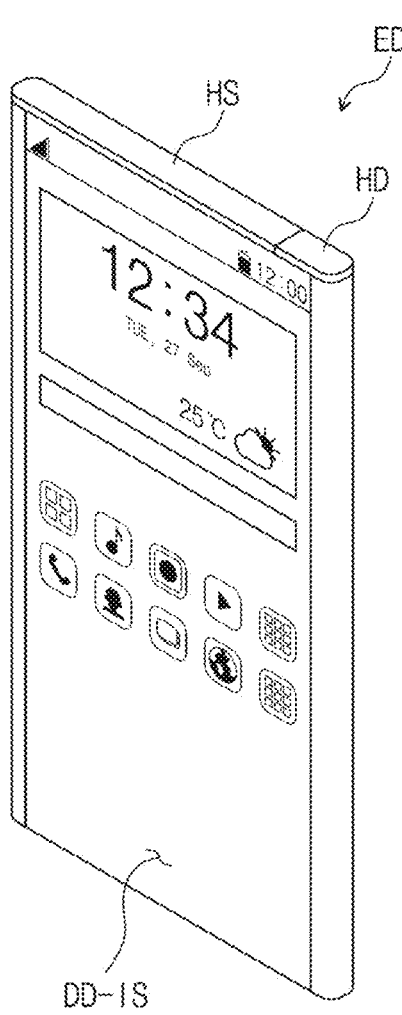
FIG. 1A is a perspective view illustrating an embodiment of an electronic device according to the inventive concept.
Figure 1A:
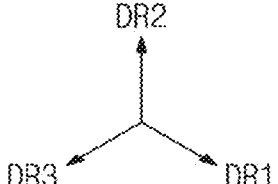

It should be noted that these drawing figures are intended to illustrate the general characteristics of methods, structure and/or materials utilized in predetermined embodiments and to supplement the written description provided below. These drawings are not, however, to scale and may not precisely reflect the precise structural or performance characteristics of any given embodiment, and should not be interpreted as defining or limiting the range of values or properties encompassed by embodiments. In an embodiment, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concepts will now be described more fully with reference to the accompanying drawings, in which embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
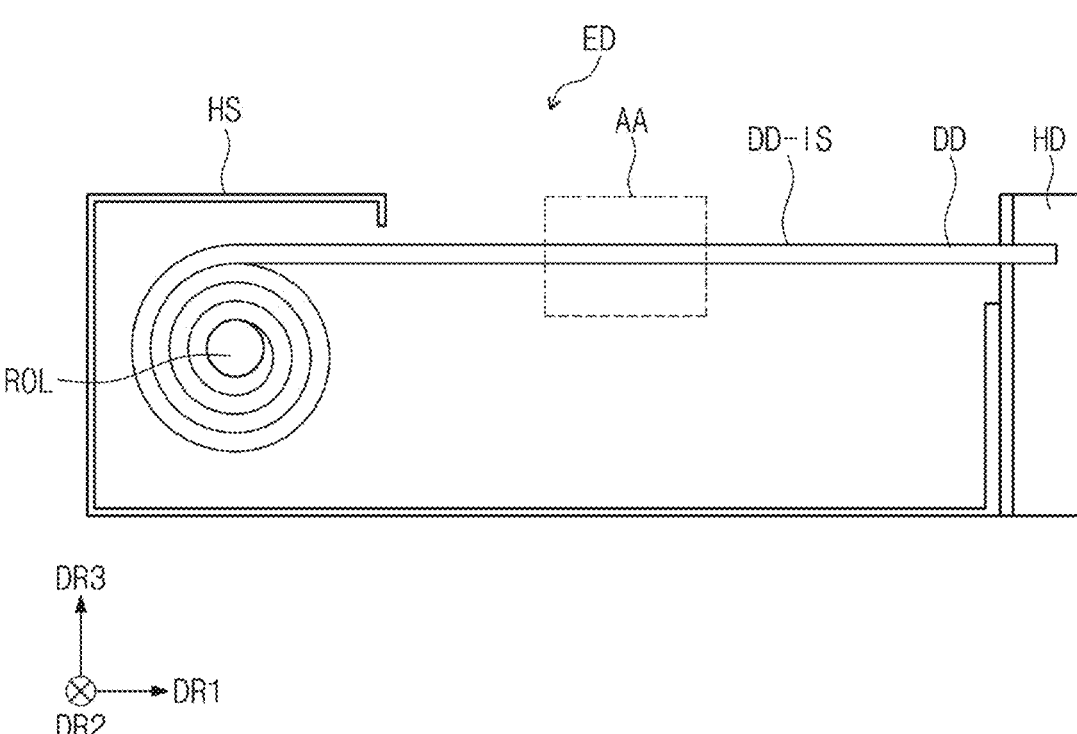
FIG. 1B is a cross-sectional view illustrating an embodiment of an electronic device according to the inventive concept.

FIG. 1A is a perspective view illustrating an embodiment of an electronic device ED according to the inventive concept. FIG. 1B is a cross-sectional view illustrating an embodiment of the electronic device ED according to the inventive concept.

A rollable cellphone is illustrated in FIGS. 1A and 1B. However, the inventive concept may be applied to a non-rollable (e.g., flexible) display device or may be applied to middle-sized or large-sized display devices, not to a small-sized display device, such as the cellphone.

Referring to FIGS. 1A and 1B, the electronic device ED may include a display device DD, a roller ROL, a holder HD, and a housing HS. Although not shown in FIGS. 1A and 1B, the electronic device ED may further include an electronic module and a power module.

FIGS. 1A and 1B illustrate the display device DD in a state (hereinafter, also referred to as a first state), in which the display device DD is included in the housing HS. The electronic device is illustrated to have a portion of the display device DD exposed from the housing HS, when the display device DD is in the first state, but the inventive concept is not limited to this embodiment. The display device DD may be fully inserted into the housing HS, when the display device DD is in the first state.

The display device DD may have a portion whose surface is used as a display surface DD-IS of a flat shape when it is not veiled by the housing HS. The display surface DD-IS may be parallel to a surface or plane that is defined by a first direction axis DR1 (or a first direction) and a second direction axis DR2 (or a second direction). A direction normal to the display surface DD-IS (i.e., a thickness direction of the display device DD) will be also referred to as a third direction axis DR3 (or a third direction). A front or top surface and a rear or bottom surface of each element may be defined, based on the third direction axis DR3.

When the display device DD is in a fully-unrolled state (hereinafter, also referred to as a second state), an area of the display surface DD-IS may be larger than that in the first state. In an embodiment, when the holder HD is pulled by a user, the display device DD may be unrolled from the roller ROL, and thus, the area of the display surface DD-IS may be increased, for example. The electronic device ED may further include a mechanical element associated with the motion of the holder HD.

The roller ROL may guide the display device DD, when the state of the electronic device ED is changed. In the first state, the roller ROL may allow for both of rolling and sliding operations of the display device DD. Although not shown, a portion of the display device DD, which is moved by the sliding operation of the roller ROL, may be moved to a storage space of the housing HS (e.g., a bottom portion of the housing HS).

Figure 2A:
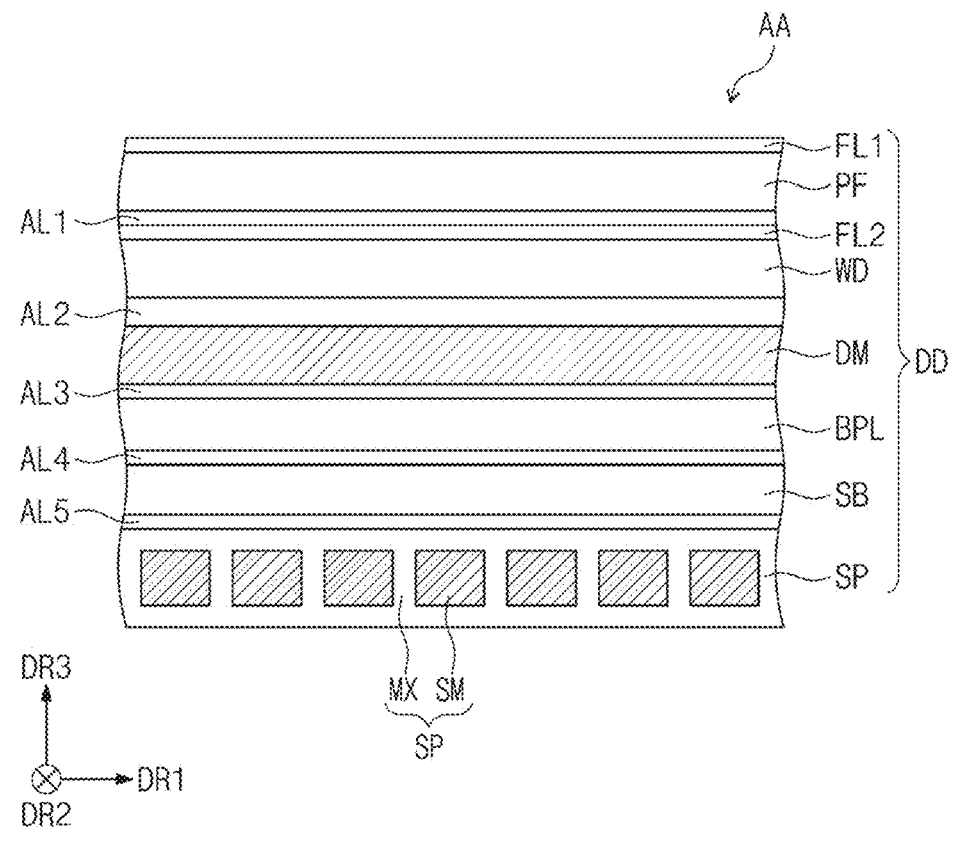
FIG. 2A is an enlarged cross-sectional view illustrating an embodiment of a display device of a region AA of FIG. 1B according to the inventive concept.
Figure 2B:
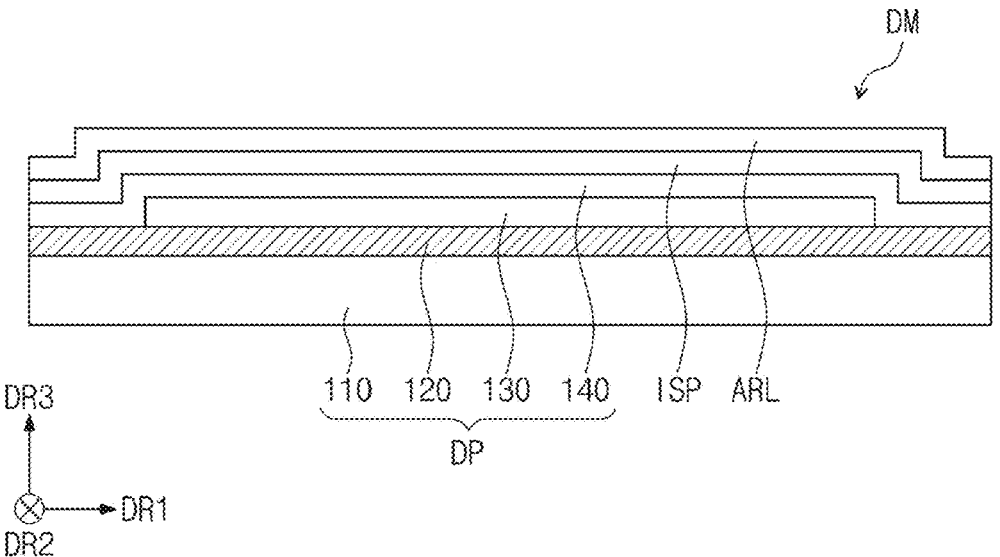
FIG. 2B is a cross-sectional view illustrating an embodiment of a display module according to the inventive concept.

FIG. 2A is an enlarged cross-sectional view illustrating an embodiment of the display device DD of a region AA of FIG. 1B according to the inventive concept. FIG. 2B is a cross-sectional view illustrating an embodiment of a display module DM according to the inventive concept.

Referring to FIG. 2A, the display device DD may include a first functional layer FL1, a window protection layer PF, a second functional layer FL2, a window WD, a display module DM, a panel protection layer BPL, a lower layer SB, a supporting member SP, and adhesive layers AL1 to AL5. Hereinafter, each or at least one of the adhesive layers AL1 to AL5 may include one of a pressure sensitive adhesive ("PSA") film or an optically clear adhesive ("OCA") film, and an overlapping description thereof may be omitted.

The window protection layer PF may be disposed on the window WD. The window protection layer PF may protect the window WD. The window protection layer PF may include a synthetic resin film. The synthetic resin film of the window protection layer PF may consist of or include at least one of polyimide, polycarbonate, polyamide, triacetyl-cellulose, polymethylmethacrylate, or polyethylene terephthalate.

The window WD may include a thin glass substrate. The thin glass substrate may be a chemically-treated tempered glass substrate. The thin glass substrate may allow for a rolling operation thereon and to reduce a wrinkle issue even when rolling and unrolling operations are repeated.

Each or at least one of the first and second functional layers FL1 and FL2 may include at least one of a hard coating layer, an anti-fingerprint coating layer, or an anti-reflection coating layer. The first functional layer FL1 may be disposed on the window protection layer PF, and the second functional layer FL2 may be disposed on the window WD. The second functional layer FL2 may be combined with the window protection layer PF through a first adhesive layer AL1.

Although not shown, a bezel pattern may be disposed on a top or bottom surface of the window WD. The bezel pattern may be a colored light-blocking layer and may be formed by, e.g., a coating method. The bezel pattern may include a base material, in which dye or pigment is mixed.

The display module DM may be disposed below the window WD. The display module DM may be combined with the window WD through a second adhesive layer AL2.

The panel protection layer BPL may be disposed below the display module DM to protect the display module DM. The panel protection layer BPL may be combined with the display module DM through a third adhesive layer AL3.

The panel protection layer BPL may include a flexible synthetic resin film. In an embodiment, the panel protection layer BPL may consist of or include a flexible plastic material (e.g., poly imide or polyethylene terephthalate), for example. The panel protection layer BPL may further include an anti-charging layer and a light-blocking layer disposed on at least one of top and bottom surfaces of the panel protection layer BPL.

The lower layer SB may be disposed below the panel protection layer BPL. The lower layer SB may be combined with the panel protection layer BPL through a fourth adhesive layer AL4. The lower layer SB may reduce a stress which is exerted on a bottom portion of the display module DM when the display device DD is rolled. The lower layer SB may consist of or include a resin material having a low elastic modulus.

The supporting member SP may be disposed below the lower layer SB. The supporting member SP may be combined with the lower layer SB through a fifth adhesive layer AL5. The supporting member SP may be disposed below the display module DM to enhance stiffness of the display device DD. The supporting member SP may further include a functional layer, which is disposed on a bottom surface of the supporting member SP. The functional layer may include at least one of a hard coating layer, an anti-fingerprint coating layer, an anti-charging coating layer, or an anti-reflection coating layer.

The supporting member SP may include a matrix layer MX and a plurality of supporting sticks SM. The matrix layer MX may consist of or include an elastomer. The supporting sticks SM may be combined with the matrix layer MX. The supporting sticks SM may be buried in the matrix layer MX and may be covered with the matrix layer MX. The supporting sticks SM may include one of stainless steel, aluminum, and carbon fiber reinforced plastic.

The supporting sticks SM may be spaced apart from each other in the first direction DR1 and may be extended in the second direction DR2. The supporting sticks SM may have a restitution force weaker than a plate-shaped structure in a rolling operation and may support an element thereon in an unrolled state.

Referring to FIG. 2B, the display module DM may include a display panel DP, an input sensor ISP, and an anti-reflection layer ARL. The display panel DP may include a base layer 110, a circuit layer 120, a light-emitting device layer 130, and an encapsulation layer 140.

The base layer 110 may provide a base surface, on which the circuit layer 120 is disposed. The base layer 110 may be a flexible substrate that may be bent, folded, or rolled. The base layer 110 may be a glass substrate, a metal substrate, or a polymer substrate. However, the inventive concept is not limited to these embodiments, and the base layer 110 may be an inorganic layer, an organic layer, or a composite layer. The base layer 110 may have a single-layered or multi-layered structure.

The circuit layer 120 may be disposed on the base layer 110. The circuit layer 120 may include an insulating layer, a semiconductor pattern, a conductive pattern, a signal line, or the like.

The light-emitting device layer 130 may be disposed on the circuit layer 120. The light-emitting device layer 130 may include a light-emitting element. In an embodiment, the light-emitting element may consist of or include an organic light-emitting material, an inorganic light-emitting material, an organic-inorganic light-emitting material, quantum dots, quantum rods, a micro-light-emitting diode ("micro-LED"), or a nano-LED, for example.

The encapsulation layer 140 may be disposed on the light-emitting device layer 130. The encapsulation layer 140 may protect the light-emitting device layer 130 from a contamination material (e.g., moisture, oxygen, and dust particles). The encapsulation layer 140 may include at least one inorganic layer. The encapsulation layer 140 may include a stacking structure, in which an inorganic layer, an organic layer, and an inorganic layer are stacked.

The input sensor ISP may be directly disposed on the display panel DP. The input sensor ISP may sense an external input from a user in an electrostatic capacitance manner and/or in an electromagnetic induction manner. The display panel DP and the input sensor ISP may be formed by processes which are successively performed. The expression "the input sensor ISP is directly disposed on the display panel DP" means that an additional element is not disposed between the input sensor ISP and the display panel DP. In other words, any additional adhesive layer may not be disposed between the input sensor ISP and the display panel DP.

The anti-reflection layer ARL may be directly disposed on the input sensor ISP. The anti-reflection layer ARL may reduce reflectance of an external light which is incident from the outside of the display device DD. The anti-reflection layer ARL may include color filters. The color filters may be arranged in a predetermined shape. In an embodiment, the color filters may be arranged in consideration of colors of lights emitted from pixels in the display panel DP, for example. In addition, the anti-reflection layer ARL may further include a black matrix that is adjacent to the color filters.

In an embodiment, the positions of the input sensor ISP and the anti-reflection layer ARL may be exchanged with each other. In an embodiment, the anti-reflection layer ARL may be replaced with a polarization film. The polarization film may be combined to the input sensor ISP through an adhesive layer.

Figure 3:
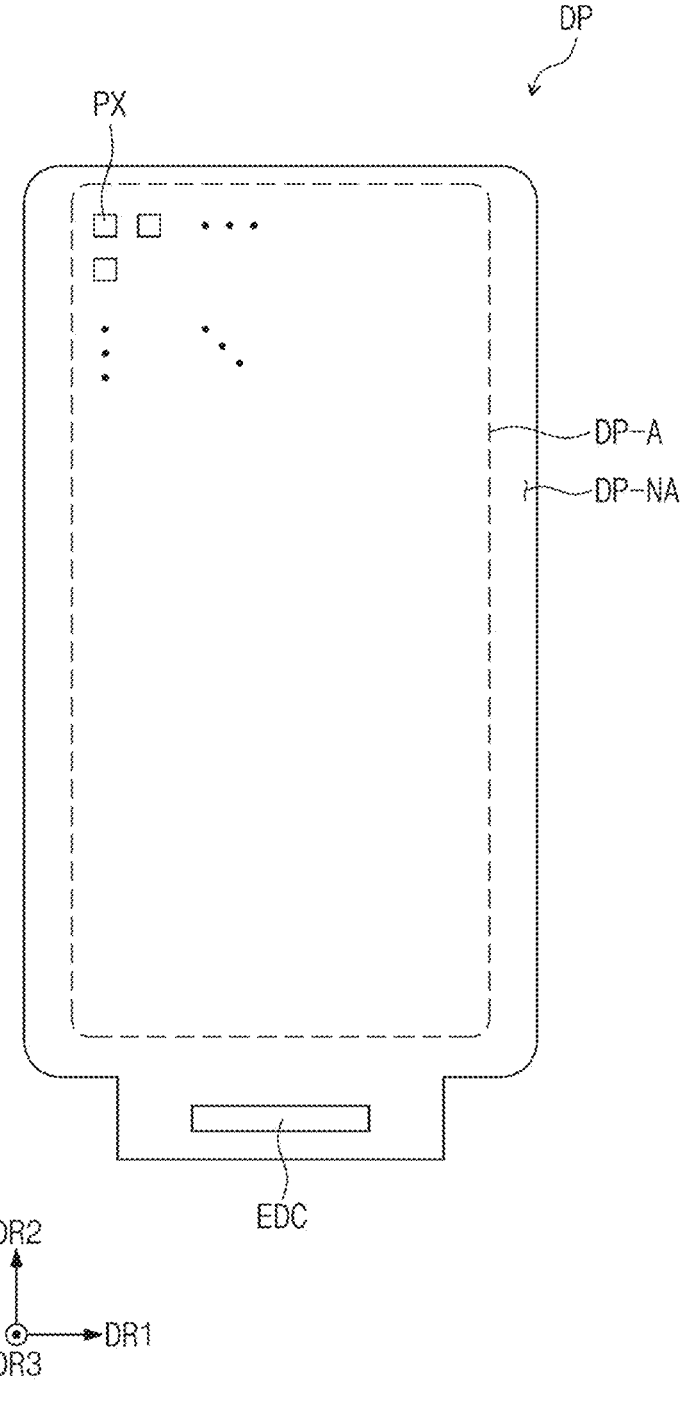
FIG. 3 is a plan view illustrating an embodiment of a display panel according to the inventive concept.
Figure 4A:
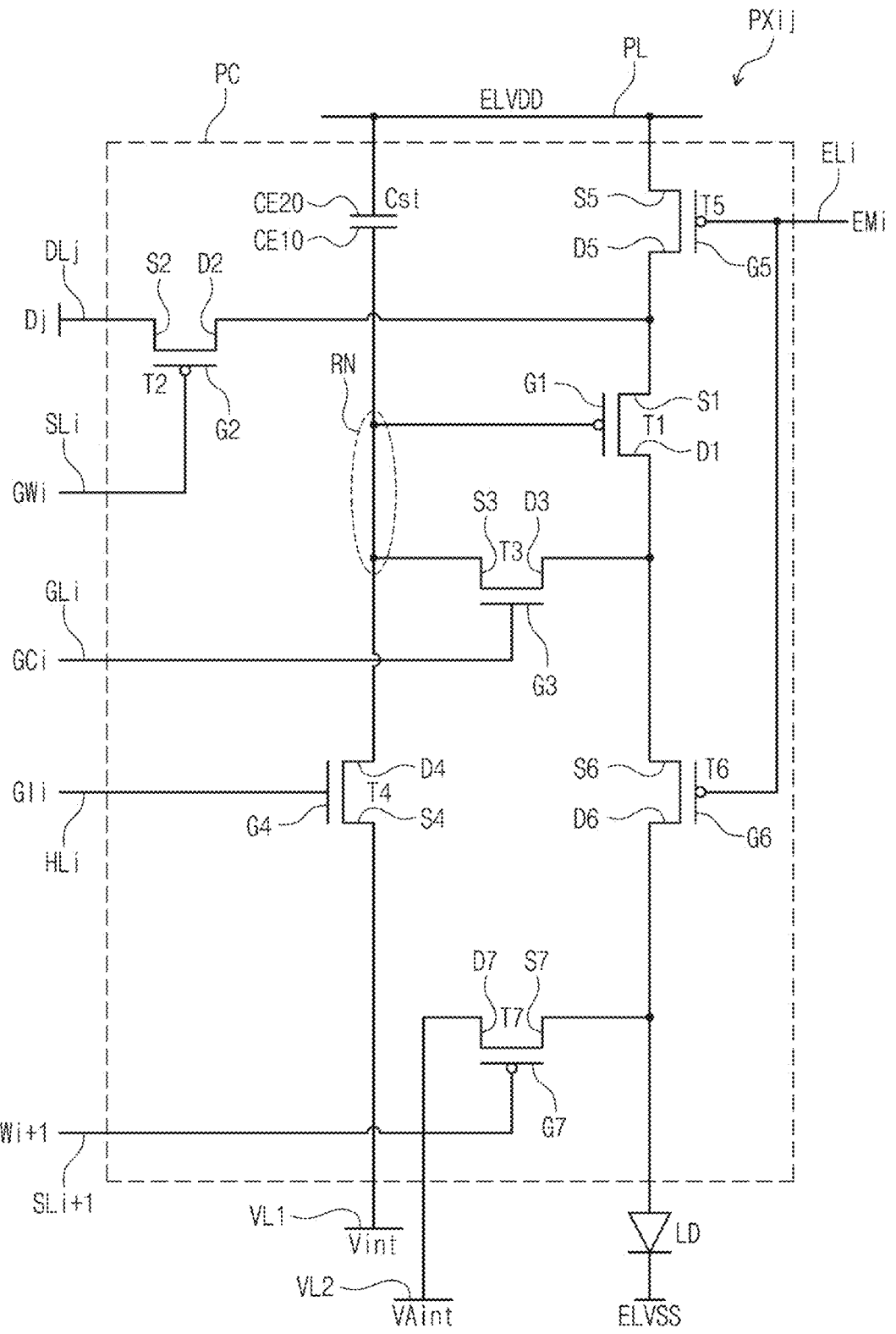
FIG. 4A is an equivalent circuit diagram illustrating an embodiment of a pixel according to the inventive concept.
Figure 4B:
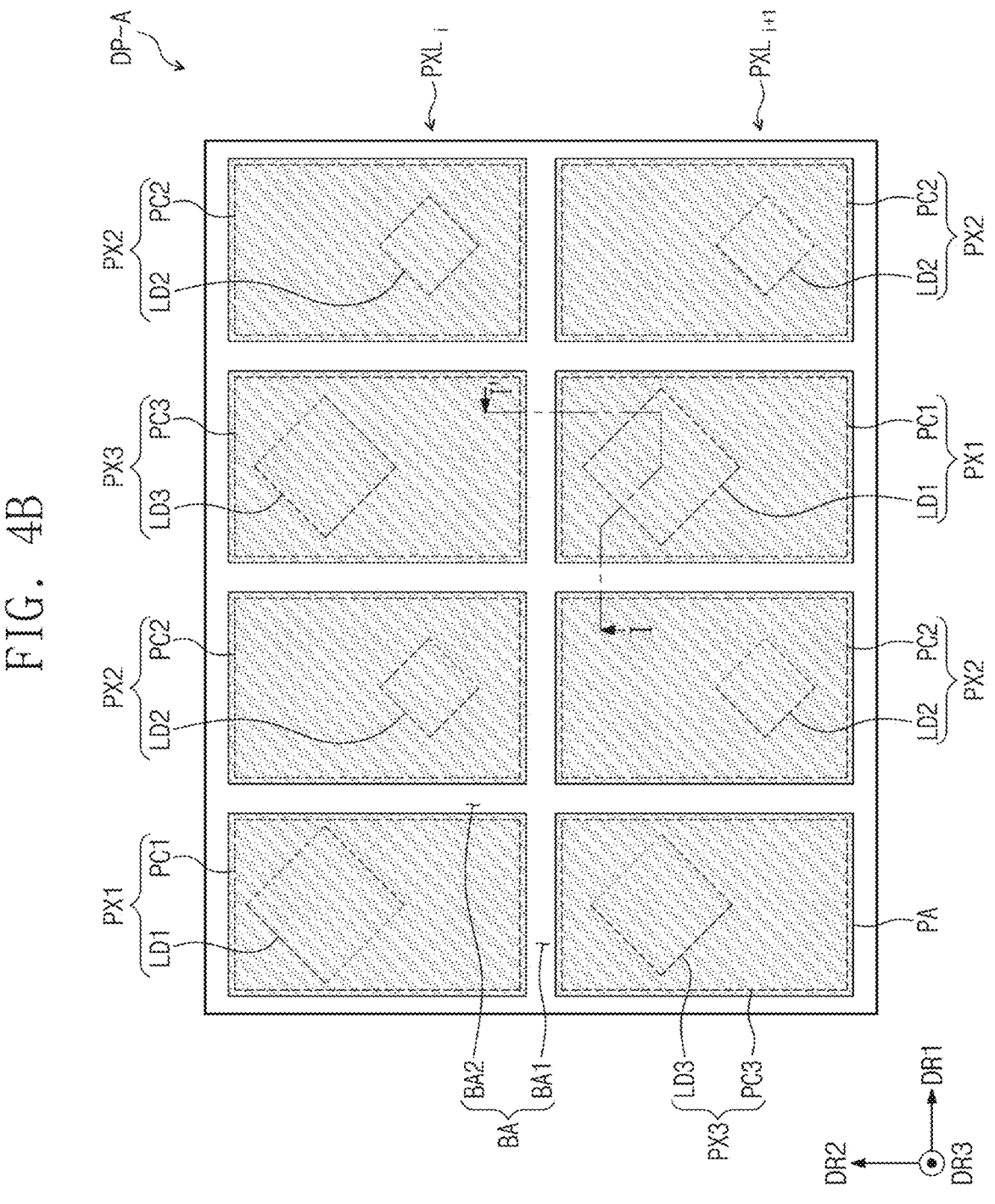
Figure 4C:
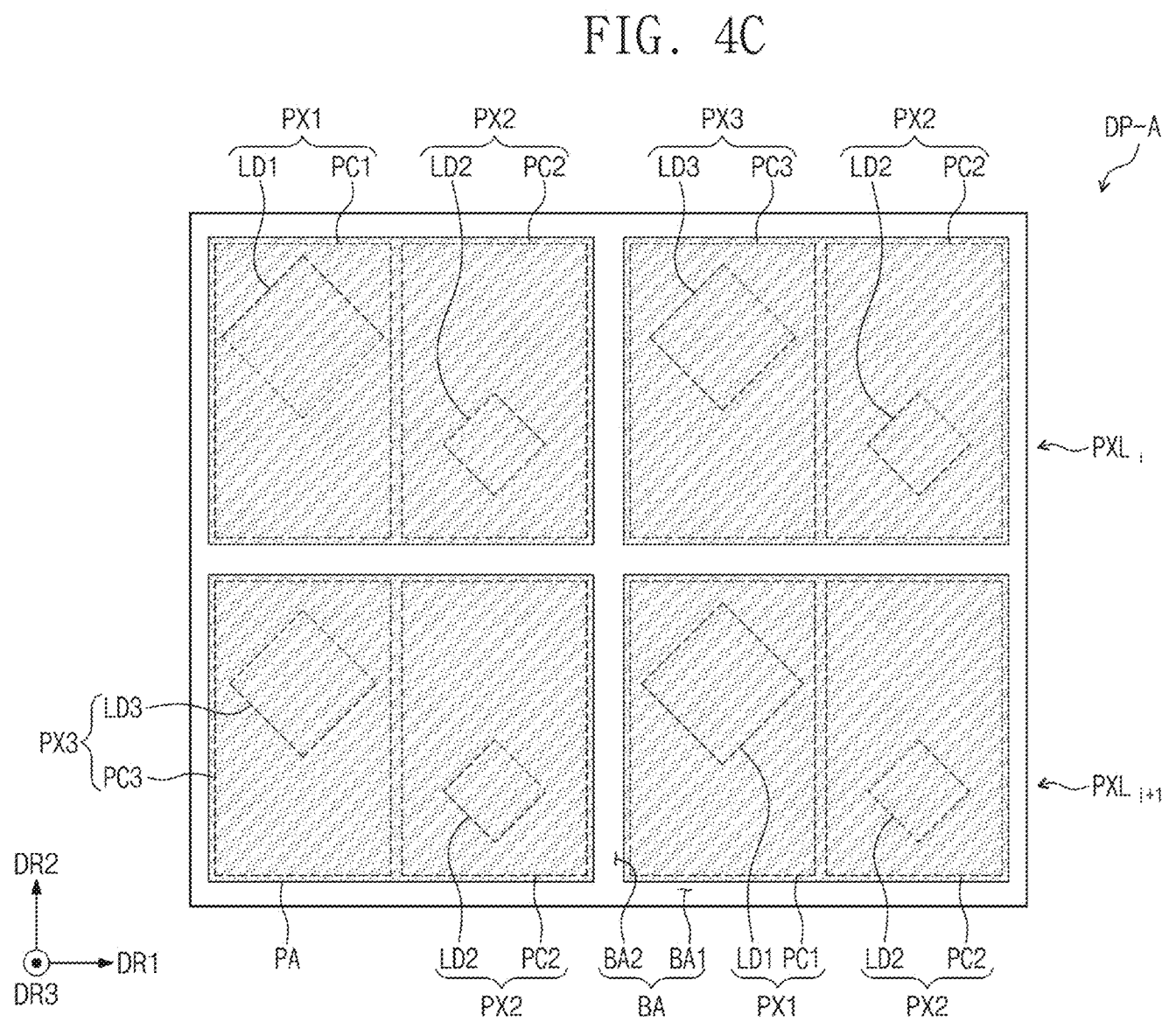
Figure 4D:
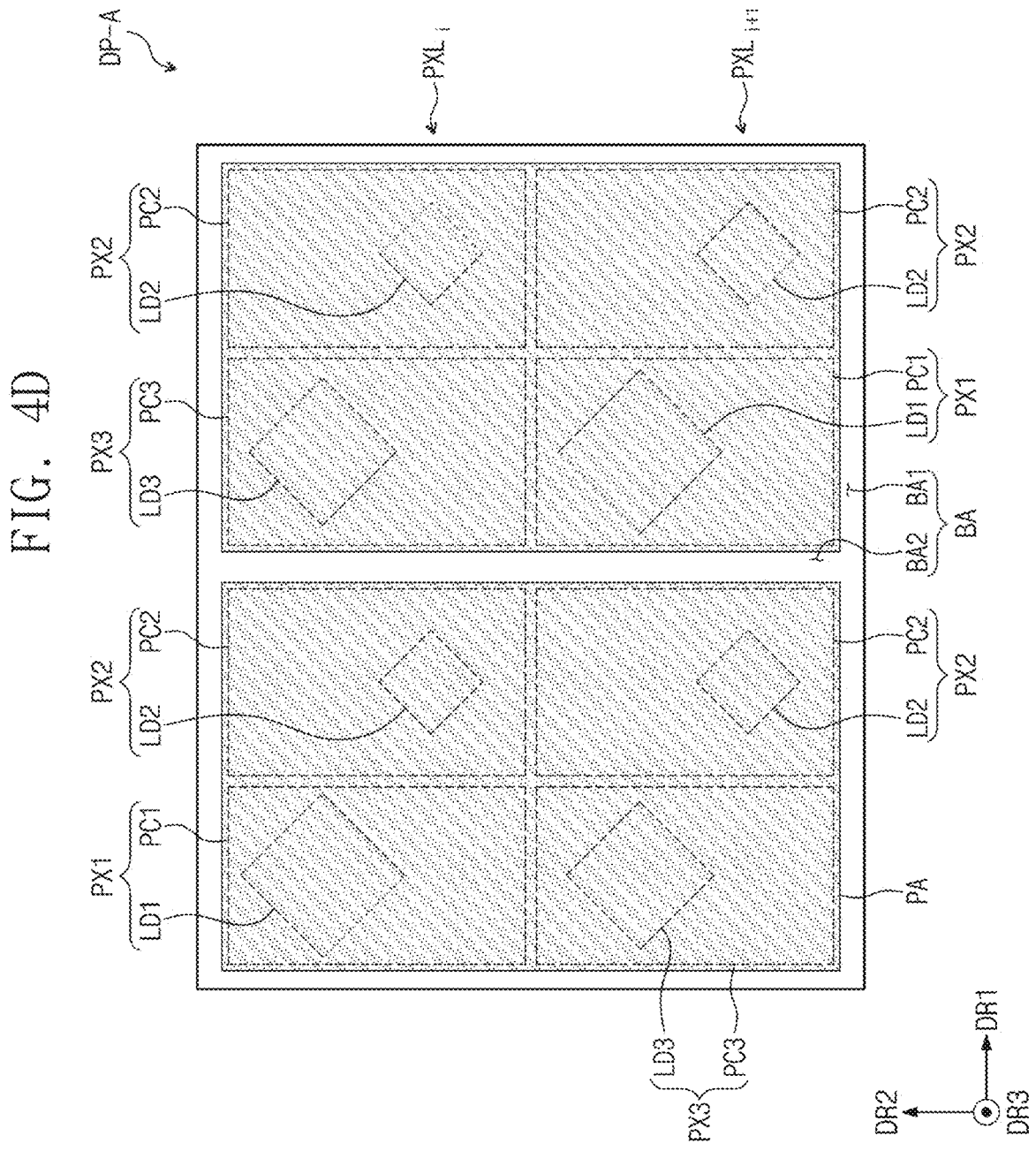
Figure 4E:
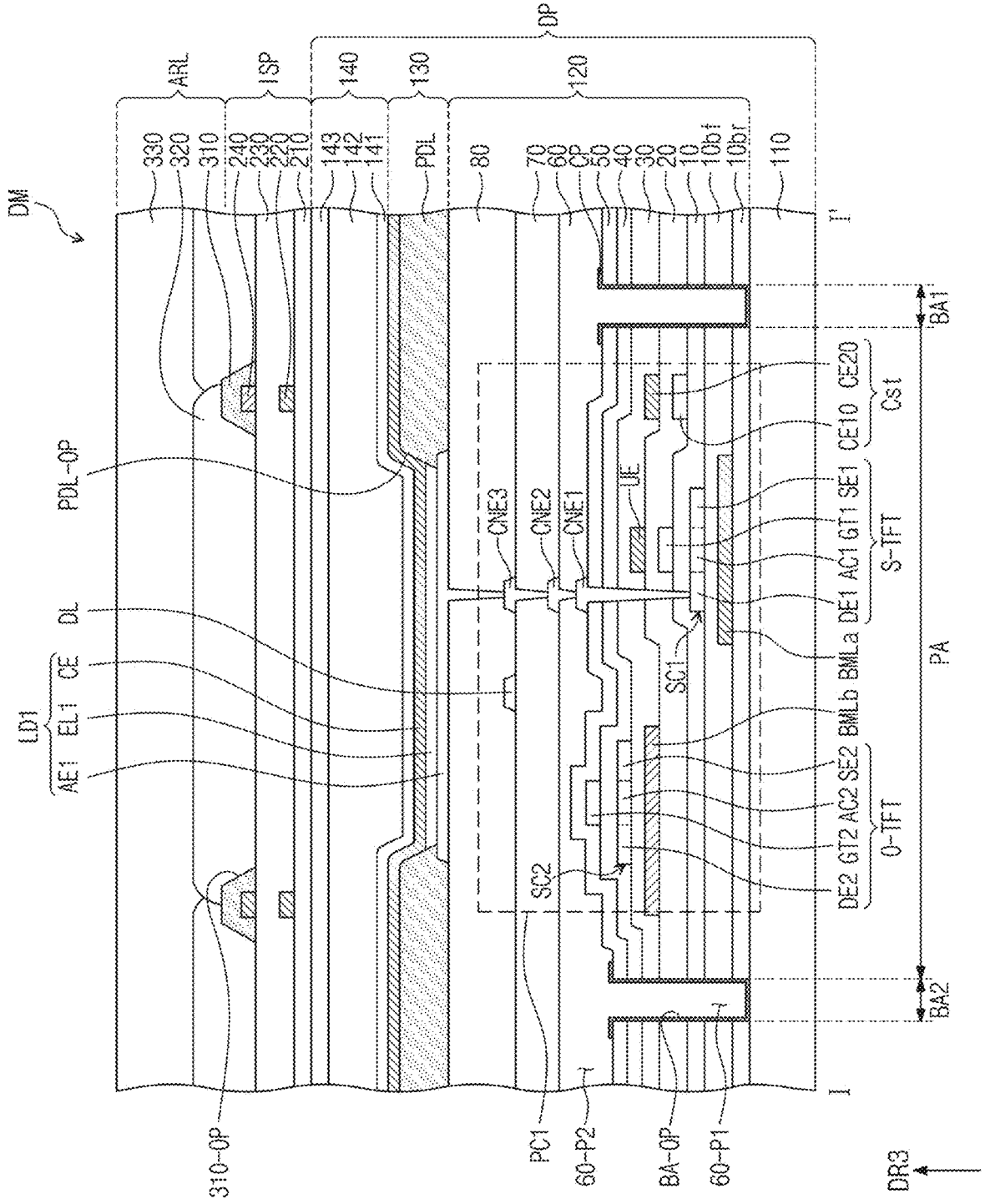
FIG. 4E is a cross-sectional view illustrating an embodiment of a display module according to the inventive concept.

FIG. 3 is a plan view illustrating an embodiment of the display panel DP according to the inventive concept. FIG. 4A is an equivalent circuit diagram illustrating an embodiment of a pixel PX according to the inventive concept. FIGS. 4B to 4D are plan views, each of which illustrates an embodiment of a display region DP-A of the display panel DP according to the inventive concept. FIG. 4E is a cross-sectional view illustrating an embodiment of the display module DM according to the inventive concept.

Referring to FIG. 3, the display panel DP may include a display region DP-A and a non-display region DP-NA. The non-display region DP-NA may be adjacent to the display region DP-A and may enclose at least a portion of the display region DP-A. A plurality of pixels PX may be disposed in the display region DP-A, and the pixel PX may not be disposed in the non-display region DP-NA. A data driving circuit EDC may be disposed in a side portion of the non-display region DP-NA.

The display region DP-A may include a plane defined by the first direction DR1 and the second direction DR2. A thickness direction of the display panel DP may be a third direction DR3, which is a normal direction of the display region DP-A. For each element constituting the display panel DP, a front or top surface and a rear or bottom surface may be defined based on the third direction DR3.

The pixels PX may be classified into a plurality of groups, which emit lights of different colors, and each of which includes lights of the same color. In an embodiment, the pixels PX may include red pixels emitting red color light, green pixels emitting green color light, and blue pixels emitting blue color light, for example. A light-emitting diode of the red pixel, a light-emitting diode of the green pixel, and a light-emitting diode of the blue pixel may include light-emitting layers including different materials. However, the inventive concept is not limited thereto, and the pixels PX may include various other color pixels.

One of the pixels (e.g., a pixel PXij connected to an i-th scan line SLi, which is one of scan lines constituting a first group, and a j-th data line DLj, which is one of a plurality of data lines) is illustrated in FIG. 4A. Here, i and j are natural numbers. The pixel PXij may include a pixel driving circuit PC (hereinafter, also referred to as a pixel circuit) and a light-emitting element LD.

In the illustrated embodiment, the pixel circuit PC may include first to seventh transistors T1 to T7 and a capacitor Cst. In the illustrated embodiment, the first, second, and fifth to seventh transistors transistor T1, T2, and T5 to T7 will be described to be p-type transistors, and the third and fourth transistors T3 and T4 will be described to be n-type transistors. However, the inventive concept is not limited to this embodiment, and each of the first to seventh transistors T1 to T7 may be realized using one of p-type or n-type transistors. An input region (or an input electrode) of the n-type transistor may be also referred to as a drain (or a drain region), an input region of the p-type transistor may be also referred to as a source (or a source region), an output region (or an output electrode) of the n-type transistor may be also referred to as a source (or a source region), and an output region of the p-type transistor may be also referred to as a drain (or a drain region). In an embodiment, at least one of the first to seventh transistors T1 to T7 may be omitted.

In the illustrated embodiment, the first transistor T1 may be a driving transistor, and the second transistor T2 may be a switching transistor. The capacitor Cst may be provided between and electrically connected to a first voltage line PL, which is applied with a first power voltage ELVDD, and a reference node RN. The capacitor Cst may include a first electrode CE10 and a second electrode CE20 which are electrically connected to the reference node RN and the first voltage line PL, respectively.

The first transistor T1 may be disposed between and electrically connected to the first voltage line PL and an electrode (e.g., an anode) of the light-emitting element LD. A source S1 of the first transistor T1 may be electrically connected to the first voltage line PL. In the specification, an expression "a transistor is electrically connected to a signal line" may mean that a source, drain, or gate of the transistor is provided to form a single object in conjunction with the signal line. An expression "a transistor is electrically connected to another transistor" may mean that a portion of the transistor is connected to the another transistor through a connection electrode. There may be an additional transistor between the source S1 of the first transistor T1 and the first voltage line PL, but in an embodiment, such an additional transistor may be omitted.

A drain D1 of the first transistor T1 may be electrically connected to an anode of the light-emitting element LD. There may be an additional transistor between the drain D1 of the first transistor T1 and the anode of the light-emitting element LD, but in an embodiment, such an additional transistor may be omitted. A gate G1 of the first transistor T1 may be electrically connected to the reference node RN.

The second transistor T2 may be disposed between and electrically connected to the j-th data line DLj and the source S1 of the first transistor T1. A source S2 of the second transistor T2 may be electrically connected to the j-th data line DLj, and a drain D2 of the second transistor T2 may be electrically connected to the source S1 of the first transistor T1. In the illustrated embodiment, a gate G2 of the second transistor T2 may be electrically connected to the i-th scan line SLi of the first group.

The third transistor T3 may be disposed between and electrically connected to the reference node RN and the drain D1 of the first transistor T1. A drain D3 of the third transistor T3 may be electrically connected to the drain D1 of the first transistor T1, and a source S3 of the third transistor T3 may be electrically connected to the reference node RN. The third transistor T3 is illustrated to have a single gate structure, but in an embodiment, the third transistor T3 may include a plurality of gates. In the illustrated embodiment, a gate G3 of the third transistor T3 may be electrically connected to an i-th scan line GLi of a second group. The fourth transistor T4 may be disposed between and electrically connected to the reference node RN and a second voltage line VL1. A drain D4 of the fourth transistor T4 may be electrically connected to the reference node RN, and a source S4 of the fourth transistor T4 may be electrically connected to the second voltage line VL1. The fourth transistor T4 is illustrated to have a single gate structure, but in an embodiment, the fourth transistor T4 may include a plurality of gates. In the illustrated embodiment, a gate G4 of the fourth transistor T4 may be electrically connected to an i-th scan line HLi of a third group.

The fifth transistor T5 may be disposed between and electrically connected to the first voltage line PL and the source S1 of the first transistor T1. A source S5 of the fifth transistor T5 may be electrically connected to the first voltage line PL, and a drain D5 of the fifth transistor T5 may be electrically connected to the source S1 of the first transistor T1. A gate G5 of the fifth transistor T5 may be electrically connected to am i-th emission line ELi.

The sixth transistor T6 may be disposed between and electrically connected to the drain D1 of the first transistor T1 and the light-emitting element LD. A source S6 of the sixth transistor T6 may be electrically connected to the drain D1 of the first transistor T1, and a drain D6 of the sixth transistor T6 may be electrically connected to an anode of the light-emitting element LD. A gate G6 of the sixth transistor T6 may be electrically connected to the i-th emission line ELi. In an embodiment, the gate G6 of the sixth transistor T6 may be connected to another signal line which is different from that for the gate G5 of the fifth transistor T5.

The seventh transistor T7 may be disposed between and electrically connected to the drain D6 of the sixth transistor T6 and a third voltage line VL2. A source S7 of the seventh transistor T7 may be electrically connected to the drain D6 of the sixth transistor T6, and a drain D7 of the seventh transistor T7 may be electrically connected to the second voltage line VL1. A gate G7 of the seventh transistor T7 may be electrically connected to an (i+1)-th scan line SLi+1 of the first group.

When an emission control signal EMi is in its high level, the fifth and sixth transistors T5 and T6 may be turned off. When the fifth and sixth transistors T5 and T6 are turned off, a current path may not be formed between the first voltage line PL and the light-emitting element LD. This interval may be defined as a non-light-emitting interval.

When a scan signal Gli applied to the i-th scan line HLi of the third group is in its high level, the fourth transistor T4 may be turned on. When the fourth transistor T4 is turned on, the reference node RN may be initialized to a first initialization voltage Vint.

When a scan signal GWi applied to the i-th scan line SLi of the first group has a low level and a scan signal GCi applied to the i-th scan line GLi of the second group has a high level, the second transistor T2 and the third transistor T3 may be turned on.

Since the reference node RN is initialized to the first initialization voltage Vint, the first transistor T1 may be in a turned-on state. When the first transistor T1 is turned on, a voltage corresponding to a data signal Dj may be provided to the reference node RN. In this case, the capacitor Cst may store a voltage corresponding to the data signal Dj. The voltage corresponding to the data signal Dj may be a voltage, which is lowered from the data signal Dj by a threshold voltage (Vth) of the first transistor T1.

When a scan signal GWi+1 applied to the (i+1)-th scan line SLi+1 of the first group has a low level, the seventh transistor T7 may be turned on. When the seventh transistor T7 is turned on, the anode of the light-emitting element LD may be initialized to a second initialization voltage VAint. A parasitic capacitor of the light-emitting element LD may be discharged.

When the emission control signal EMi has a low level, the fifth and sixth transistors T5 and T6 may be turned on. When the fifth transistor T5 is turned on, the first power voltage ELVDD may be provided to the first transistor T1. When the sixth transistor T6 is turned on, the first transistor T1 may be electrically connected to the light-emitting element LD. The light-emitting element LD may emit light which has a brightness corresponding to an amount of a current supplied thereto.

FIG. 4B illustrates a portion of the display region DP-A corresponding to two pixel rows $PXL_i$ and $PXL_{i+1}$. The i-th pixel row $PXL_i$ may include a first color pixel PX1, a second color pixel PX2, a third color pixel PX3, and another second color pixel PX2, which are arranged in the first direction DR1. The (i+1)-th pixel row $PXL_{i+1}$ may include a third color pixel PX3, a second color pixel PX2, a first color pixel PX1, and another second color pixel PX2, which are arranged in the first direction DR1. The four color pixels in each of the pixel rows $PXL_i$ and $PXL_{i+1}$ shown in FIG. 4B may be repeatedly disposed in the first direction DR1. The pixel rows $PXL_i$ and $PXL_{i+1}$ shown in FIG. 4B may be repeatedly disposed in the second direction DR2. In FIG. 4B, anodes of first, second, and third light-emitting elements LD1, LD2, and LD3 are depicted by dotted lines.

The display region DP-A may include a plurality of pixel regions PA and a boundary region BA between the pixel regions PA. The boundary region BA may be disposed to be adjacent to at least a portion of each of the pixel regions PA.

Referring to FIG. 4B, one of the first, second, and third color pixels PX1, PX2, and PX3 may be disposed in each of the pixel regions PA, and each of the pixel regions PA may be enclosed by the boundary region BA. The boundary region BA may include a first region BA1, which is extended in the first direction DR1, and a second region BA2, which is extended in the second direction DR2.

The pixel circuits PC1, PC2, and PC3 of the first to third color pixels PX1, PX2, and PX3 may be disposed in the pixel regions PA, respectively. Each of the pixel circuits PC1, PC2, and PC3 may be substantially the same as the pixel circuit PC described with reference to FIG. 4A. Each of the pixel circuits PC1, PC2, and PC3 is illustrated to occupy substantially the same area as the pixel region PA, but the inventive concept is not limited to this embodiment.

It may be enough to define the pixel region PA as a remaining portion of the display region DP-A excluding the boundary region BA. The boundary region BA may be a region defined by an opening BA-OP, which will be described in more detail with reference to FIG. 4E, and a portion of the display region DP-A, which is not overlapped with the opening BA-OP, may correspond to the pixel region PA.

Referring to FIG. 4C, two adjacent ones of the first color pixel PX1, the second color pixel PX2, the third color pixel PX3, and the second color pixel PX2 may be enclosed by the boundary region BA. As shown in FIG. 4D, one first color pixel PX1, one third color pixel PX3, and two second color pixels PX2 may be disposed in each pixel region PA.

FIG. 4E illustrates a section of the display module DM taken along line I-I' of FIG. 4B.

The first light-emitting element LD1, a silicon transistor S-TFT, and an oxide transistor O-TFT are illustrated in FIG. 4E. The input sensor ISP may be disposed on the display panel DP, and the anti-reflection layer ARL may be disposed on the input sensor ISP.

In the equivalent circuit shown in FIG. 4A, the third and fourth transistors T3 and T4 may be the oxide transistors O-TFT, and the remaining transistors may be the silicon transistors S-TFT. In an embodiment, the pixel circuit may include only one kind of transistors (i.e., one or the other of the silicon and oxide transistors S-TFT and O-TFT). In the case where the pixel circuit includes the transistors of only one kind, a stacking structure of inorganic layers, which will be described below, may be changed.

The silicon transistor S-TFT shown in FIG. 4E may be the sixth transistor T6 of FIG. 4A, and the oxide transistor O-TFT may be the third transistor T3 of FIG. 4A.

The base layer 110 may be overlapped with the pixel region PA and the boundary region BA. In FIG. 4E, one of the pixel regions PA and the first and second regions BA1 and BA2 adjacent thereto are illustrated.

A barrier layer 10*br* may be disposed on the base layer 110. The barrier layer 10*br* may prevent an external contamination material from passing through the same. The barrier layer 10*br* may include at least one inorganic layer. The barrier layer 10*br* may include a silicon oxide layer and a silicon nitride layer. In an embodiment, the barrier layer 10*br* may include a plurality of silicon oxide layers and a plurality of silicon nitride layers that are alternately stacked.

A first shielding electrode BMLa may be disposed on the barrier layer 10*br*. The first shielding electrode BMLa may consist of or include at least one of metallic materials. The first shielding electrode BMLa may consist of or include at least one of molybdenum (Mo) having a good heat-resistant property, molybdenum-containing alloys, titanium (Ti), or titanium-containing alloys. In an embodiment, a bias voltage may be applied to the first shielding electrode BMLa. The first shielding electrode BMLa may receive the first power voltage ELVDD. The first shielding electrode BMLa may prevent the silicon transistor S-TFT from being affected by a variation of an electric potential (e.g., caused by an electric dipole moment or polarization phenomenon). In addition, the first shielding electrode BMLa may prevent an external light from being incident into the silicon transistor S-TFT. In an embodiment, the first shielding electrode BMLa may be a floating electrode, which is electrically isolated from other electrodes or interconnection lines.

A buffer layer 10*bf* may be disposed on the barrier layer 10*br*. The buffer layer 10*bf* may prevent metal atoms or impurities from being diffused from the base layer 110 into a first semiconductor pattern SC1 thereon. The buffer layer 10*bf* may include at least one inorganic layer. The buffer layer 10*bf* may include a silicon oxide layer and a silicon nitride layer.

The first semiconductor pattern SC1 may be disposed on the buffer layer 10*bf*. The first semiconductor pattern SC1 may consist of or include a silicon-based semiconductor material. In an embodiment, the silicon semiconductor may consist of or include amorphous silicon, poly silicon, or the like, for example. In an embodiment, the first semiconductor pattern SC1 may consist of or include low-temperature poly silicon, for example.

FIG. 4E is presented to illustrate just a portion of the first semiconductor pattern SC1, and the first semiconductor patterns SC1 may be arranged throughout the pixel region PA (e.g., see FIG. 4B) under a predetermined rule. The first semiconductor pattern SC1 may have electrical characteristics that vary depending on a doping concentration thereof. The first semiconductor pattern SC1 may include a first region of high conductivity and a second region of low conductivity. The first region may be doped with n-type or p-type dopants. A p-type transistor may include a doping region that is doped with p-type dopants, and an n-type transistor may include a doping region that is doped with n-type dopants. The second region may be an undoped region or may be a doing region having a lower doping concentration than the first region.

The conductivity of the first region may be higher than the conductivity of the second region, and the first region may be used as an electrode or a signal line substantially. The second region may correspond to a channel or active region of a transistor. In other words, a portion of the first semiconductor pattern SC1 may be used as a channel of a transistor, another portion may be used as a source or drain of the transistor, and other portion may be used as a connection electrode or a connection signal line.

A source region SE1, a channel region (also referred to as an active region) AC1, and a drain region DE1 of the silicon transistor S-TFT may be formed from the first semiconductor pattern SC1. The source region SE1 and the drain region DE1 may be extended from the channel region AC1 in opposite directions, when viewed in a cross-sectional view.

A first insulating layer 10 may be disposed on the buffer layer 10bf. The first insulating layer 10 may cover the first semiconductor pattern SC1. The first insulating layer may be an inorganic layer. The first insulating layer 10 may consist of or include at least one of aluminum oxide, titanium oxide, silicon oxide, silicon nitride, silicon oxynitride, zirconium oxide, and hafnium oxide.

The first insulating layer 10 may be a single-layered silicon oxide layer. Not only the first insulating layer 10 but also an inorganic layer of the circuit layer 120 to be described below may have a single-layered or multi-layered structure and may consist of or include at least one of the afore-described materials, but the inventive concept is not limited to this embodiment.

A gate GT1 of the silicon transistor S-TFT may be disposed on the first insulating layer 10. The gate GT1 may be a portion of a metal pattern. The gate GT1 may be overlapped with the channel region AC1. In a process of doping the first semiconductor pattern SC1, the gate GT1 may be used as a mask. The gate GT1 may consist of or include at least one of molybdenum (Mo) having a good heat-resistant property, molybdenum-containing alloys, titanium (Ti), or titanium-containing alloys, but the inventive concept is not limited to this embodiment.

The first electrode CE10 of the capacitor Cst may be disposed on the first insulating layer 10. As shown in FIG. 4E, the first electrode CE10 and the gate GT1 may be spaced apart from each other when viewed in a cross-sectional view, but the first electrode CE10 and the gate GT1 may be provided to form a single object, in a plan view.

A second insulating layer 20 may be disposed on the first insulating layer 10 to cover the gate GT1. An upper electrode UE may be disposed on the second insulating layer 20 to be overlapped with the gate GT1. The second electrode CE20 may be disposed on the second insulating layer 20 to be overlapped with the first electrode CE10. In a plan view, the second electrode CE20 and the upper electrode UE may be provided to form a single object. The second electrode CE20 and the upper electrode UE may consist of or include at least one of molybdenum (Mo) having a good heat-resistant property, molybdenum-containing alloys, titanium (Ti), or titanium-containing alloys.

A second shielding electrode BMLb may be disposed on the second insulating layer 20. The second shielding electrode BMLb may be disposed below the oxide transistor O-TFT to correspond to the oxide transistor O-TFT. In an embodiment, the second shielding electrode BMLb may be omitted. In an embodiment, the first shielding electrode BMLa may be extended to a region below the oxide transistor O-TFT and may be used as a shielding element, instead of the second shielding electrode BMLb.

A third insulating layer 30 may be disposed on the second insulating layer 20. A second semiconductor pattern SC2 may be disposed on the third insulating layer 30. The second semiconductor pattern SC2 may include a channel region AC2 of the oxide transistor O-TFT. The second semiconductor pattern SC2 may consist of or include at least one of oxide semiconductor materials. In an embodiment, the second semiconductor pattern SC2 may consist of or include at least one of transparent conductive oxide ("TCO") materials (e.g., indium tin oxide ("ITO"), indium zinc oxide ("IZO"), indium gallium zinc oxide ("IGZO"), zinc oxide (ZnOx), or indium oxide ($In_2O_3$)).

The oxide semiconductor material may include a plurality of regions, which are classified depending on whether a transparent conductive oxide is reduced or not. In an embodiment, the oxide semiconductor material may include a reduced region, in which the transparent conductive oxide is reduced, and a non-reduced region, in which the transparent conductive oxide is not reduced, and here, the reduced region may have conductivity higher than that of the non-reduced region, for example. The reduced region may be substantially used as a source or drain of a transistor or a signal line. The non-reduced region may be substantially used as a semiconductor region (e.g., a channel) of a transistor. In other words, a portion of the second semiconductor pattern SC2 may be a semiconductor region of a transistor, another portion of the second semiconductor pattern SC2 may be a source or drain region of the transistor, and other portion of the second semiconductor pattern SC2 may be a signal transmission region.

A fourth insulating layer 40 may be disposed on the third insulating layer 30. The fourth insulating layer 40 may be partially overlapped with the second semiconductor pattern SC2. In an embodiment, the fourth insulating layer 40 may be partially overlapped with the second semiconductor pattern SC2. A gate GT2 of the oxide transistor O-TFT may be disposed on the fourth insulating layer 40.

The gate GT2 of the oxide transistor O-TFT may be a portion of a metal pattern. The gate GT2 of the oxide transistor O-TFT may be overlapped with the channel region AC2. The gate GT2 may consist of or include at least one of molybdenum (Mo) having a good heat-resistant property, molybdenum-containing alloys, titanium (Ti), or titanium-containing alloys. In an embodiment, the gate GT2 may include a titanium layer and a molybdenum layer disposed on the titanium layer.

A fifth insulating layer 50 may be disposed on the fourth insulating layer 40 to cover the gate GT2. Each of the first and fifth insulating layers 10 to 50 may be an inorganic layer.

The barrier layer 10br, the buffer layer 10bf, and the first to fifth insulating layers 10, 20, 30, 40, and 50 described above may be defined as a stacking structure of inorganic layers disposed on the base layer 110. The opening BA-OP may be defined in the stacking structure of the inorganic layers. The opening BA-OP may correspond to the boundary region BA described with reference to FIG. 4B and may form a valley in the display panel DP. The opening BA-OP may include a first opening region corresponding to the first region BA1 of FIG. 4B and a second opening region corresponding to the second region BA2, in a plan view. The opening BA-OP may expose a top surface of the base layer 110.

The stacking structure of the inorganic layers may be divided into a plurality of island-shaped portions corresponding to a plurality of pixels PX1, PX2, and PX3 shown in FIG. 4B. In this case, an external impact may be concentrated on the opening BA-OP, and thus, a crack issue may be prevented from occurring in the stacking structure of the inorganic layers. In addition, the opening BA-OP may prevent a crack, which is produced in a predetermined pixel region, from being extended to a neighboring pixel region.

Since the supporting member SP of FIG. 2A includes supporting sticks, not a plate-shaped element, an external impact exerted on a region between the supporting sticks SM may lead to local deformation of the display panel DP. A fraction of the external impact, which is not absorbed by the supporting member SP, may be absorbed by the opening BA-OP and the organic material disposed in the opening BA-OP, and thus, it may be possible to reduce a failure in the display panel DP.

An inorganic pattern CP may be disposed in the opening BA-OP. Various inorganic materials may be used as the inorganic pattern CP, and the inventive concept is not limited to a predetermined material for the inorganic pattern CP. In an embodiment, the inorganic pattern CP may consist of or include at least one of silicon oxide, silicon nitride, or silicon oxynitride, for example.

The inorganic pattern CP may contact side surfaces of the barrier layer 10br, the buffer layer 10bf, and the first to fifth insulating layers 10 to 50 defining the opening BA-OP. The inorganic pattern CP may cover a partial region of the base layer 110 exposed to the opening BA-OP (e.g., a portion of the top surface of the base layer 110). The partial region of the base layer 110 exposed to the opening BA-OP may be a part of a moisture infiltration path. Moisture, which is infiltrated through this path, may result in deterioration of the light-emitting element LD1. Here, the inorganic pattern CP may block the infiltration path and may prevent the moisture from being supplied to an element thereon.

The formation of the inorganic pattern CP may include forming an inorganic layer through an atomic layer deposition ("ALD") method or a chemical vapor deposition ("CVD") method. The inorganic pattern CP may be locally formed on a desired region by patterning the inorganic layer.

The inorganic pattern CP may expose most of the top surface of the fifth insulating layer 50. In an embodiment, the inorganic pattern CP may not be formed on the top surface of the fifth insulating layer 50, unlike the embodiment of FIG. 4E, in which a portion of the inorganic pattern CP is disposed on the top surface of the fifth insulating layer 50. In the case where the inorganic pattern CP is an inorganic layer, the afore-described stacking structure of the inorganic layers may have an increased thickness and worsen flexibility. In addition, a crack issue may occur in the inorganic layer.

A first connection electrode CNE1 may be disposed on the fifth insulating layer 50. The first connection electrode CNE1 may be coupled to the drain region DE1 of the silicon transistor S-TFT through a contact hole penetrating the first to fifth insulating layers 10, 20, 30, 40, and 50.

At least one organic layer may be disposed on the fifth insulating layer 50. In the illustrated embodiment, first to third organic layer 60 to 80 may be disposed on the fifth insulating layer 50, but the inventive concept is not limited to a predetermined structure of insulating layers stacked on the fifth insulating layer 50.

The first organic layer 60 may be disposed on the fifth insulating layer 50. The first organic layer 60 may fill the opening BA-OP. The first organic layer 60 may contact the inorganic pattern CP. The first organic layer 60 may be provided to remove a height difference created by inorganic layers thereunder or to have a flat top surface. The first organic layer 60 may cover at least a portion of the top surface of the fifth insulating layer 50, because the inorganic pattern CP is patterned as described above.

The first organic layer 60 may include a first portion 60-P1, which is provided in the opening BA-OP and contacts the inorganic pattern CP, and a second portion 60-P2, which is disposed on the fifth insulating layer 50. Substantially, the first portion 60-P1 may correspond to an organic pattern, and the second portion 60-P2 may correspond to an organic layer. In the illustrated embodiment, the first and second portions 60-P1 and 60-P2 of the first organic layer 60 are provided as a single object, but in an embodiment, the first portion 60-P1 and the second portion 60-P2 may be separately formed by different processes.

The second organic layer 70 and the third organic layer 80 may be disposed on the first organic layer 60. Each of the first to third organic layers 60 to 80 may consist of or include at least one of general-purposed polymers (e.g., benzocyclobutene ("BCB"), polyimide, hexamethyldisiloxane ("HMDSO"), polymethylmethacrylate ("PMMA"), or polystyrene ("PS")), polymer derivatives having a phenol-based group, acryl-based polymers, imide-based polymers, arylether-based polymers, amide-based polymers, fluorine-based polymers, p-xylene-based polymers, vinylalcohol-based polymers, or blends thereof.

A second connection electrode CNE2 may be disposed on the first organic layer 60. The second connection electrode CNE2 may be coupled to the first connection electrode CNE1 through a contact hole penetrating the first organic layer 60. A third connection electrode CNE3 may be disposed on the second organic layer 70. The third connection electrode CNE3 may be coupled to the second connection electrode CNE2 through a contact hole penetrating the second organic layer 70. A data line DL may be disposed on the second organic layer 70.

An anode AE1 of the first light-emitting element LD1 may be disposed on the third organic layer 80. The first light-emitting element LD1 may include the anode AE1, a light-emitting layer EML1, and a cathode CE (or a common electrode). The second electrodes in the first to third light-emitting elements LD1 to LD3 described with reference to FIG. 4B and the cathode CE of the first light-emitting element LD1 may be a single body. In other words, the cathode CE may be provided in common in the first light-emitting element LD1, the second light-emitting element LD2, and the third light-emitting element LD3.

The anode AE1 may be a transparent electrode, a semitransparent electrode, or a reflective electrode. In an embodiment, the anode AE1 may include a reflection layer, which includes Ag, Mg, Al, Pt, Pd, Au, Ni, Nd, Ir, Cr, or compounds thereof, and a transparent or semitransparent electrode layer, which is formed on the reflection layer. The transparent or semitransparent electrode layer may consist of or include at least one of ITO, IZO, IGZO, zinc oxide (ZnOx) or indium oxide ($In_2O_3$), and aluminum doped zinc oxide ("AZO"). In an embodiment, the anode AE1 may have a structure, in which ITO, Ag, and ITO layers are stacked.

A pixel definition layer PDL may be disposed on the third organic layer 80. The pixel definition layer PDL may have a transparent property or a light-absorbing property. In an embodiment, the pixel definition layer PDL having the light-absorbing property may include a black coloring agent, for example. The black coloring agent may include black dye or black pigment. The black coloring agent may include metallic materials (e.g., carbon black and chromium) or oxides thereof. The pixel definition layer PDL may correspond to a shielding pattern having a light-blocking property.

The pixel definition layer PDL may cover a portion of the anode AE1. In an embodiment, an opening PDL-OP may be defined in the pixel definition layer PDL to expose a portion of the anode AE1. The pixel definition layer PDL may increase a distance between an edge portion of the anode AE1 and the cathode CE. Thus, the pixel definition layer PDL may prevent an arcing issue from occurring at the edge portion of the anode AE1.

Although not shown, a hole control layer may be disposed between the anode AE1 and the light-emitting layer EML1. The hole control layer may include a hole transport layer and may further include a hole injection layer. An electron control layer may be disposed between the light-emitting layer EML1 and the cathode CE. The electron control layer may include an electron transport layer and may further include an electron injection layer. The hole control layer and the electron control layer may be defined in common in a plurality of pixel rows (e.g., see $PXL_i$ and $PXL_{i+1}$ of FIG. 4B) using an open mask.

The encapsulation layer 140 may be disposed on the light-emitting device layer 130. The encapsulation layer 140 may include an inorganic encapsulation layer 141, an organic encapsulation layer 142, and an inorganic encapsulation layer 143, which are sequentially stacked, but the layers constituting the encapsulation layer 140 are not limited to this embodiment.

The inorganic encapsulation layers 141 and 143 may protect the light-emitting device layer 130 from moisture and oxygen, and the organic encapsulation layer 142 may protect the light-emitting device layer 130 from a contamination material such as dust particles. In an embodiment, the inorganic encapsulation layers 141 and 143 may include a silicon nitride layer, a silicon oxynitride layer, a silicon oxide layer, a titanium oxide layer, or an aluminum oxide layer. The organic encapsulation layer 142 may include an acrylic-based organic layer, but the inventive concept is not limited to this embodiment.

The input sensor ISP may be disposed on the display panel DP. The input sensor ISP may include at least one conductive layer and at least one insulating layer. In the illustrated embodiment, the input sensor ISP may include a first insulating layer 210, a first conductive layer 220, a second insulating layer 230, and a second conductive layer 240.

The first insulating layer 210 may be directly disposed on the display panel DP. The first insulating layer 210 may be an inorganic layer including at least one of silicon nitride, silicon oxynitride, or silicon oxide. Each of the first and second conductive layers 220 and 240 may have a single-layered structure or may have a multi-layered structure including a plurality of layers stacked in the third direction DR3. The first and second conductive layers 220 and 240 may include conductive lines defining a mesh-shaped electrode. The conductive line of the first conductive layer 220 and the conductive line of the second conductive layer 240 may be connected to each other through a contact hole penetrating the second insulating layer 230, but in an embodiment, they may not be connected to each other. The connection structure between the conductive lines of the first and second conductive layers 220 and 240 may be determined depending on a kind of a sensor formed by the input sensor ISP.

The first and second conductive layers 220 and 240 of the single-layered structure may include a metal layer or a transparent conductive layer. The metal layer may consist of or include at least one of molybdenum, silver, titanium, copper, aluminum, or alloys thereof. The transparent conductive layer may consist of or include at least one of transparent conductive oxides (e.g., ITO, IZO, zinc oxide (ZnOx), or indium zinc tin oxide ("IZTO")). In an alternative embodiment, the transparent conductive layer may consist of or include at least one of conductive polymer (e.g., "PEDOT"), metal nano wire, or graphene.

The first and second conductive layers 220 and 240 of the multi-layered structure may include metal layers. In an embodiment, the metal layers may have a triple-layered structure including a titanium layer, an aluminum layer, and a titanium layer, for example. The conductive layer of the multi-layered structure may include at least one metal layer and at least one transparent conductive layer. The second insulating layer 230 may be disposed between the first and second conductive layers 220 and 240.

The anti-reflection layer ARL may be disposed on the input sensor ISP. The anti-reflection layer ARL may include a division layer 310, a color filter 320, and a planarization layer 330.

In an embodiment, as long as a material has a light absorbing property, it may be used for the division layer 310. The division layer 310 may be a layer of black color, and in an embodiment, the division layer 310 may include a black coloring agent. The black coloring agent may include black dye or black pigment. The black coloring agent may include metallic materials (e.g., carbon black and chromium) or oxides thereof.

The division layer 310 may cover the second conductive layer 240 of the input sensor ISP. The division layer 310 may prevent an external light from being reflected by the second conductive layer 240. An opening 310-OP may be defined in the division layer 310. The opening 310-OP may be overlapped with the anode AE1.

The color filter 320 may be overlapped with the opening 310-OP. The color filter 320 may be overlapped with the light-emitting element LD1 therebelow. The color filter 320 may contact the division layer 310.

The planarization layer 330 may cover the division layer 310 and the color filter 320. The planarization layer 330 may consist of or include an organic material and may be provided to have a flat or planarized top surface. In an embodiment, the planarization layer 330 may be omitted.

Figure 5A:
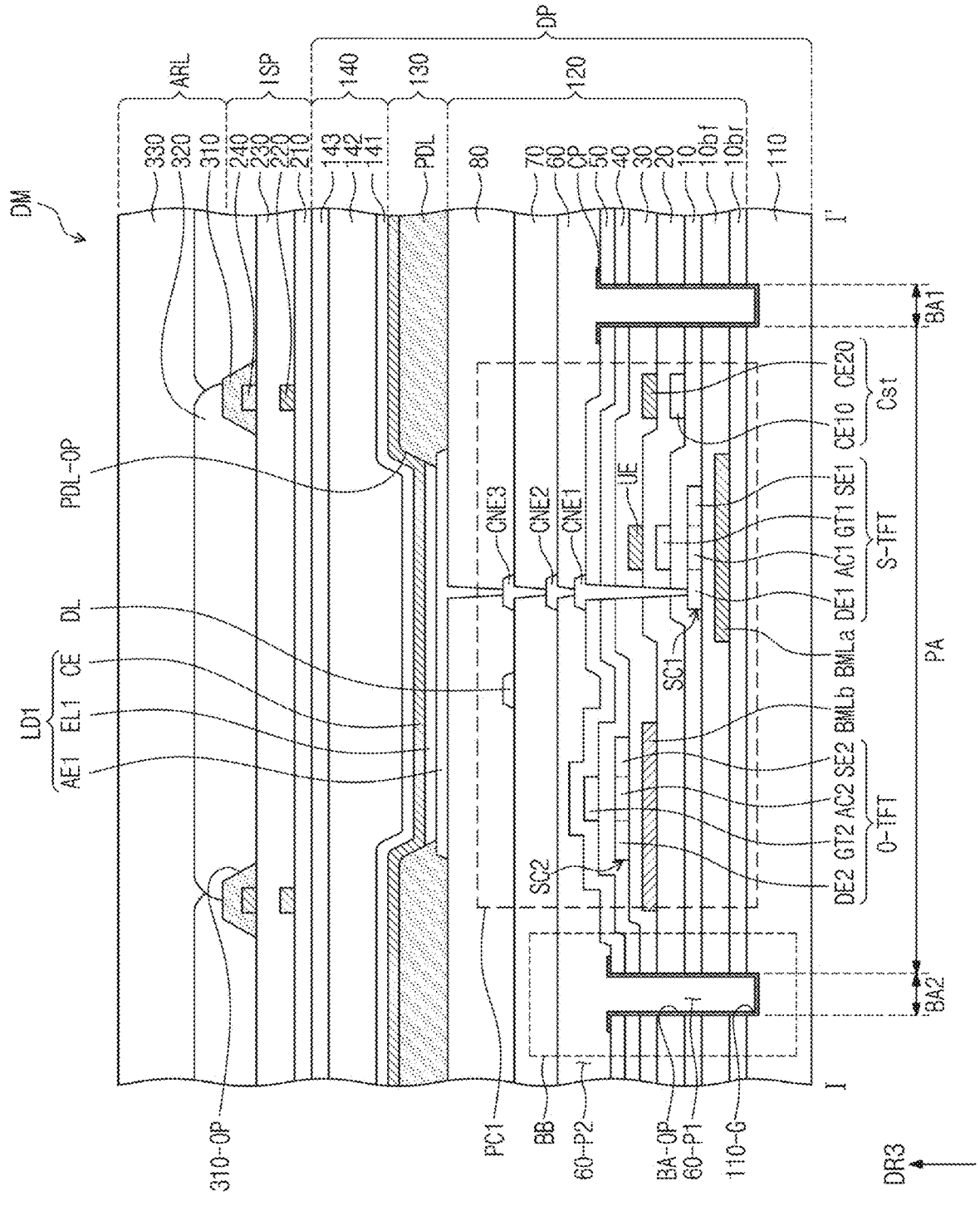
FIG. 5A is a cross-sectional view illustrating an embodiment of a display module according to the inventive concept.
Figure 5B:
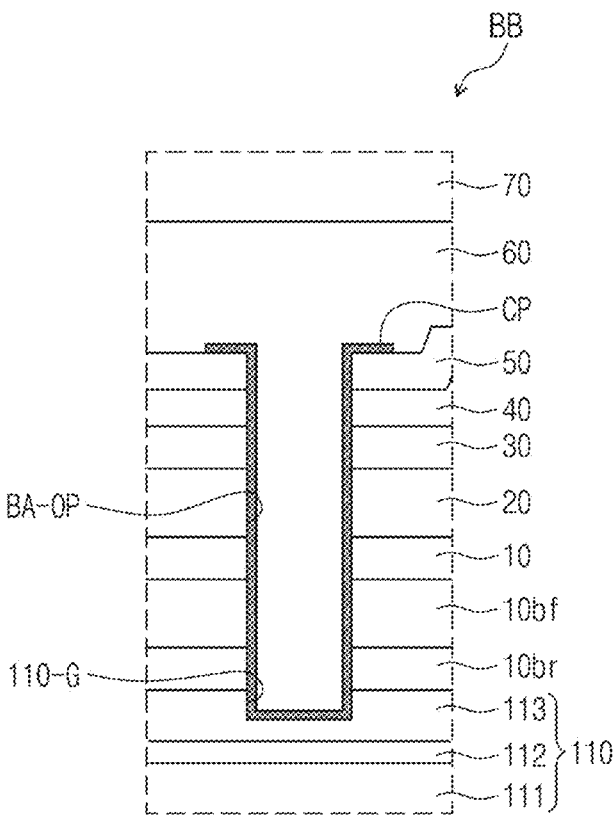
FIG. 5B is an enlarged cross-sectional view illustrating a region BB of FIG. 5A.
Figure 5C:
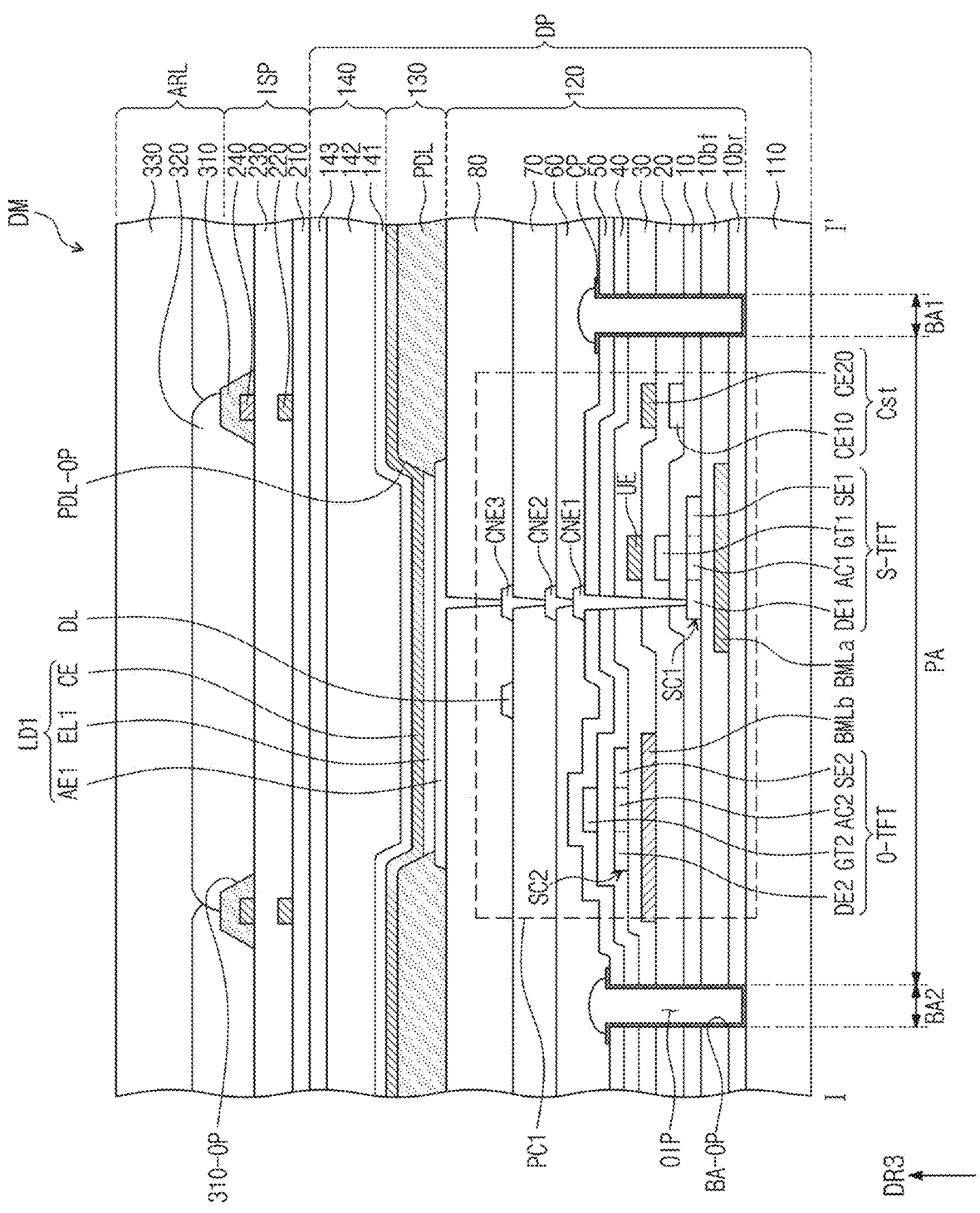
FIG. 5C is a cross-sectional view illustrating an embodiment of a display module according to the inventive concept.

FIG. 5A is a cross-sectional view illustrating an embodiment of the display module DM according to the inventive concept. FIG. 5B is an enlarged cross-sectional view illustrating an embodiment of a region BB of FIG. 5A. FIG. 5C is a cross-sectional view illustrating an embodiment of the display module DM according to the inventive concept. In the following description, an element previously described with reference to FIGS. 1A to 4E may be identified by the same reference number without repeating an overlapping description thereof, for the sake of brevity.

Referring to FIG. 5A, a groove 110-G, which is extended from the opening BA-OP, may be defined in the base layer 110. The groove 110-G may have the same shape as that of the opening BA-OP, in a plan view.

The opening BA-OP and the groove 110-G may be formed by the same process, and in an embodiment, when the opening BA-OP is formed to have a depth larger than a total thickness of the stacking structure of the inorganic layers (i.e., a sum of thicknesses of the barrier layer 10br, the buffer layer 10bf, and the first to fifth insulating layers 10 to 50), the groove 110-G may be formed. The inorganic pattern CP, which is formed by a deposition process, may be disposed in the groove 110-G.

Referring to FIG. 5B, the base layer 110 may have a multi-layered structure. The base layer 110 may include a first synthetic resin layer 111, a single or multiple inorganic layer 112 (hereinafter, also referred to as a barrier inorganic layer), and a second synthetic resin layer 113 disposed on the barrier inorganic layer 112. Each of the first and second synthetic resin layers 111 and 113 may consist of or include a polyimide-based resin, but the inventive concept is not limited to this embodiment. The barrier inorganic layer 112 may include at least one of a silicon oxide layer, a silicon nitride layer, or a silicon oxynitride layer.

The groove 110-G may be defined in the second synthetic resin layer 113. The groove 110-G of the base layer 110 may be a groove or opening, which is defined in the second synthetic resin layer 113.

Referring to FIG. 5C, the first organic layer 60 and an organic pattern OIP may be separately formed, unlike the first organic layer 60 of FIG. 4E provided as a single object. The organic pattern OIP may be disposed in the opening BA-OP and may contact the inorganic pattern CP, similar to the first portion 60-P1 of FIG. 4E. The first organic layer 60 may be disposed on the fifth insulating layer 50 and may contact the fifth insulating layer 50, similar to the second portion 60-P2 of FIG. 4E. The first organic layer 60 and the organic pattern OIP may consist of or include different materials from each other; for example, the organic pattern OIP may include a material having an elastic modulus lower than the first organic layer 60.

Figure 6A:
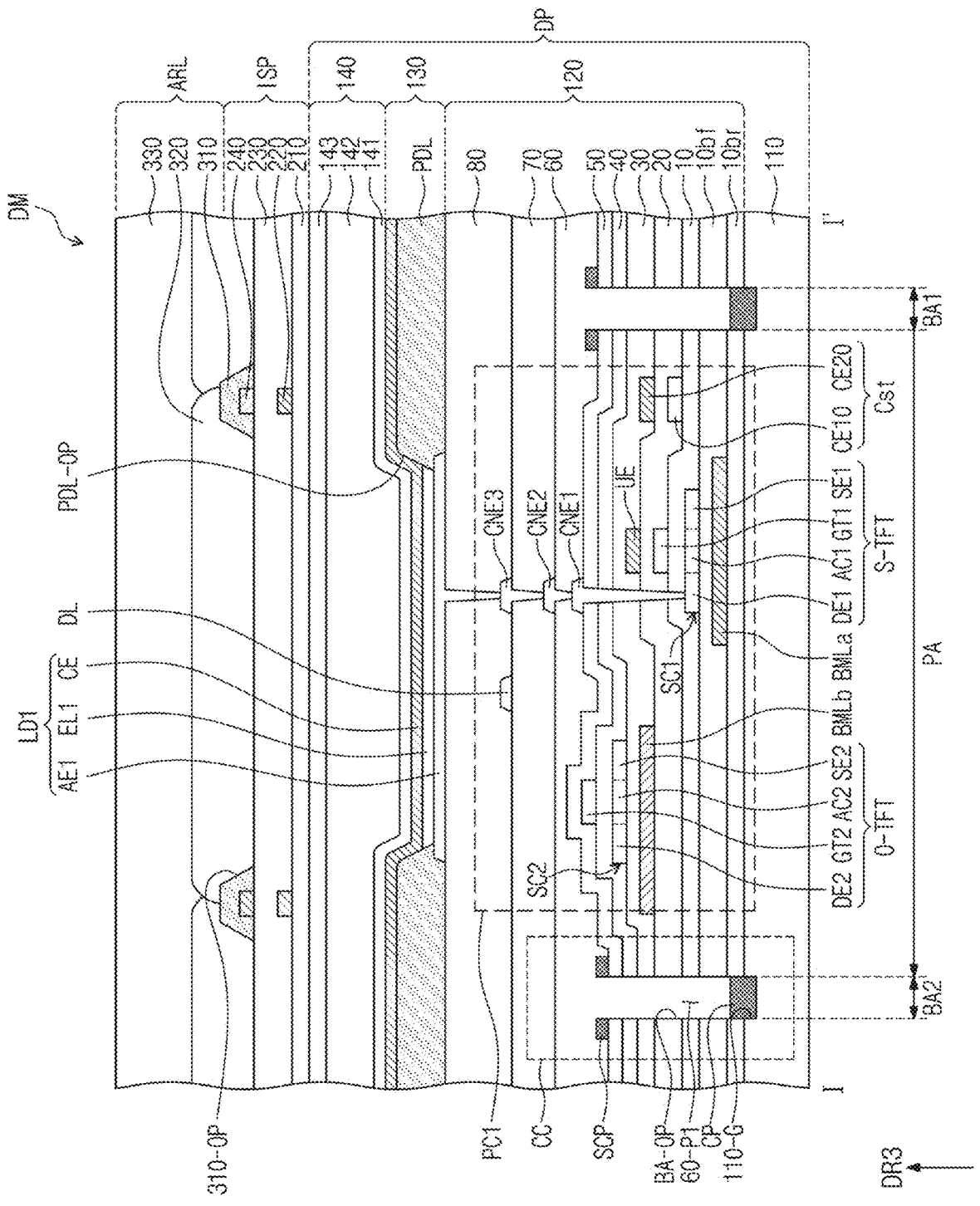
FIG. 6A is a cross-sectional view illustrating an embodiment of a display module according to the inventive concept.
Figure 6B:
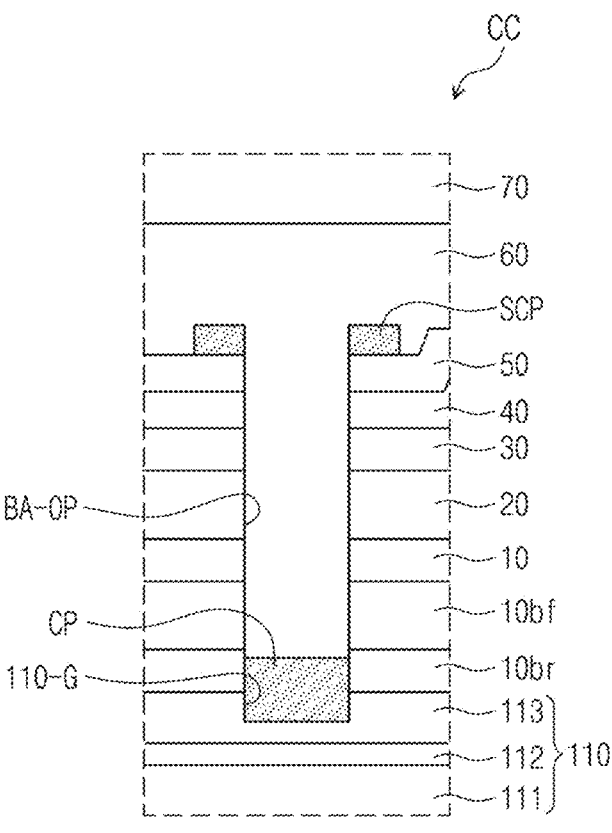
FIG. 6B is an enlarged cross-sectional view illustrating a region CC of FIG. 6A.

FIG. 6A is a cross-sectional view illustrating an embodiment of the display module DM according to the inventive concept. FIG. 6B is an enlarged cross-sectional view illustrating a region CC of FIG. 6A. In the following description, an element previously described with reference to FIGS. 1A to 5C may be identified by the same reference number without repeating an overlapping description thereof, for the sake of brevity.

The inorganic pattern CP may be disposed in the opening BA-OP. However, the inorganic pattern CP may not contact a side surface of at least one of the barrier layer 10_br_, the buffer layer 10_bf_, and the first to fifth insulating layers 10 to 50 defining the opening BA-OP. In the illustrated embodiment, the inorganic pattern CP may be in non-contact with side surfaces of the first to fifth insulating layers 10 to 50. The inorganic pattern CP may be formed by an inductively-coupled plasma CVD ("ICP-CVD") method. In the ICP-CVD method, a deposition source may be anisotropically deposited, and thus, the inorganic pattern CP may be deposited in only a thickness direction. Accordingly, the inorganic pattern CP may expose side surfaces of the first to fifth insulating layers 10 to 50.

In the case where, as in the illustrated embodiment, the groove 110-G is defined in the base layer 110, the inorganic pattern CP may be disposed in the groove 110-G and may contact a side surface of the barrier layer 10_br_. Since the inorganic pattern CP contacts the side surface of the barrier layer 10_br_, a penetration path of moisture may be blocked. When a thickness of the inorganic pattern CP is increased, the inorganic pattern CP may contact the side surface of the buffer layer 10_bf_ or the side surface of at least one of the first to fifth insulating layers 10 to 50. In the case where the thickness of the inorganic pattern CP is increased, a contact area between the inorganic pattern CP and the stacking structure of the inorganic layers may be increased and a sealing effect may be improved.

In the process of forming the inorganic pattern CP, a sub-inorganic pattern SCP may be further formed on the top surface of the fifth insulating layer 50. An inorganic layer may be formed by the ICP-CVD method, and then, the inorganic layer may be patterned to form the sub-inorganic pattern SCP on the top surface of the fifth insulating layer 50. Due to the peculiar properties of the ICP-CVD process, the sub-inorganic pattern SCP may be disposed to be spaced apart from the inorganic pattern CP in the third direction DR3.

Although not shown, in the case where the groove 110-G is not defined in the base layer 110, the inorganic pattern CP may be disposed on the top surface of the base layer 110. In the embodiment of FIG. 5C, in the case where the organic pattern OIP is disposed in the opening BA-OP, the organic pattern OIP may be disposed on the sub-inorganic pattern SCP.

Figure 7:
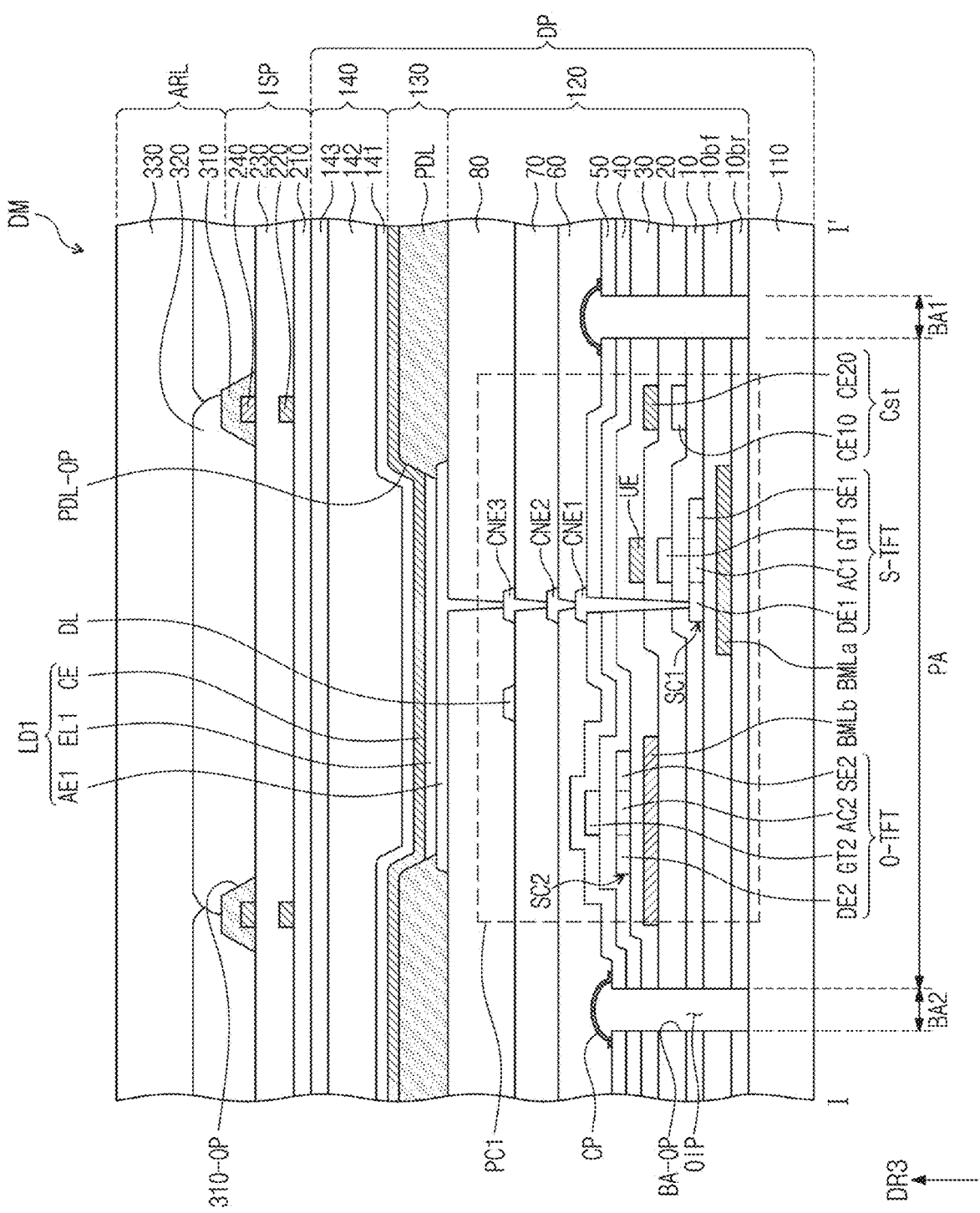
FIG. 7 is a cross-sectional view illustrating an embodiment of a display module according to the inventive concept.

FIG. 7 is a cross-sectional view illustrating an embodiment of the display module DM according to the inventive concept. In the following description, an element previously described with reference to FIGS. 1A to 6B may be identified by the same reference number without repeating an overlapping description thereof, for the sake of brevity.

Referring to FIG. 7, the opening BA-OP may be defined in the stacking structure of the inorganic layers. Unlike that in FIG. 5C, the inorganic pattern CP may not be disposed in the opening BA-OP, and the organic pattern OIP may be disposed in the opening BA-OP. The organic pattern OIP in the opening BA-OP may absorb an external impact concentrated on the opening BA-OP.

The inorganic pattern CP may cover the organic pattern OIP and may be provided to contact the uppermost one (i.e., 50) of the insulating layers 10 to 50 and thereby to seal the organic pattern OIP. Thus, the inorganic pattern CP may block moisture, which is supplied from the outside to seep along the organic pattern OIP. The moisture may be prevented from being permeated into the light-emitting element LD1, which is provided on the inorganic pattern CP, and thus, it may be possible to prevent the light-emitting element LD1 from being failed.

The first organic layer 60 may cover the inorganic pattern CP and may contact a top surface of the fifth insulating layer 50, which is not veiled by the inorganic pattern CP. By reducing an area occupied by the inorganic pattern CP, it may be possible to prevent a crack issue from occurring in the inorganic pattern CP when the state of the electronic device ED is changed.

Although not shown in FIG. 7, the groove 110-G of FIGS. 5A and 5B may be defined in the base layer 110. In this case, the organic pattern OIP may be further disposed in the groove 110-G.

In an embodiment of the inventive concept, an opening may be defined in a stacking structure of inorganic layers to form a valley in a display panel, and in this case, the stacking structure of inorganic layers may be divided into island-shaped portions. The valley may make it possible to improve flexibility and impact-resistant characteristics of the display panel.

An inorganic pattern may be provided to block a moisture infiltration path, which is formed by the opening or valley. Thus, it may be possible to prevent a light-emitting element from being deteriorated by the moisture.

While embodiments of the inventive concept have been particularly shown and described, it will be understood by one of ordinary skill in the art that variations in form and detail may be made therein without departing from the spirit and scope of the attached claims.

What is claimed is:

1. An electronic device comprising:
a display device comprising:
    a display module including a plurality of pixel regions
    and a boundary region, the display module compris-
    ing:
        a base layer overlapped with the plurality of pixel
        regions and the boundary region;
        a plurality of inorganic layers which are disposed on
        the base layer and in which an opening is defined
        at a position corresponding to the boundary
        region;
        an inorganic pattern different from the plurality of
        inorganic layers, disposed in the opening and
        covering a region of the base layer exposed by the
        opening;
        an organic layer disposed on the plurality of inor-
        ganic layers;
        a light-emitting element disposed on the organic
        layer and in each of the plurality of pixel regions;
        and
        a transistor disposed between the base layer and the
        organic layer and electrically connected to the
        light-emitting element,
    wherein the organic layer is disposed in the opening,
    contacts the inorganic pattern and contacts an out-
    ermost inorganic layer of the plurality of inorganic
    layers farthest from the base layer,
    wherein the opening is defined in each of the plurality
    of inorganic layers.

2. The electronic device of claim 1, wherein a groove is
defined in the base layer, and
    the groove is defined corresponding to the boundary
    region and is extended from the opening.

3. The electronic device of claim 2, wherein the inorganic
pattern is further disposed in the groove.

4. The electronic device of claim 2, wherein the base layer
comprises a first synthetic resin layer, a barrier inorganic
layer disposed on the first synthetic resin layer, and a second
synthetic resin layer disposed on the barrier inorganic layer,
and
    the groove is defined in the second synthetic resin layer.

5. The electronic device of claim 1, wherein the inorganic
pattern contacts side surfaces of the plurality of inorganic
layers defining the opening.

6. The electronic device of claim 5, wherein the inorganic
pattern is further disposed on a region of a top surface of the
outermost inorganic layer of the plurality of inorganic lay-
ers.

7. The electronic device of claim 1, further comprising a
sub-inorganic pattern, which is disposed on a top surface of
the outermost inorganic layer of the plurality of inorganic
layers and is spaced apart from the inorganic pattern,
    wherein the sub-inorganic pattern is covered with the
    organic layer.

8. The electronic device of claim 1, further comprising a
supporting member disposed below the display module,
    wherein the supporting member comprises a matrix layer
    and a plurality of supporting sticks, which are com-
    bined with the matrix layer, are extended in a first
    direction, and are arranged in a second direction cross-
    ing the first direction.

9. The electronic device of claim 8, further comprising:
a window disposed on the display module; and
a window protection layer disposed on the window.

10. The electronic device of claim 1, wherein the display
module further comprises:

a thin encapsulation layer covering the light-emitting
    element;
    an input sensor disposed on the thin encapsulation layer;
    and
    a color filter disposed on the input sensor and overlapped
    with the light-emitting element.

11. The electronic device of claim 1, wherein the transis-
tor comprises a silicon transistor including a silicon semi-
conductor pattern and an oxide transistor including an oxide
semiconductor pattern, and
    the silicon semiconductor pattern and the oxide semicon-
    ductor pattern are respectively disposed on different
    ones of the plurality of inorganic layers.

12. The electronic device of claim 1, wherein the display
module is rollable by a roller.

13. The electronic device of claim 1, wherein each of the
plurality of pixel regions is enclosed by the boundary region.

14. An electronic device comprising:
a display device comprising:
    a display module including a plurality of pixel regions
    and a boundary region, the display module compris-
    ing:
        a base layer overlapped with the plurality of pixel
        regions and the boundary region;
        a plurality of inorganic layers which are disposed on
        the base layer and in which an opening is defined
        at a position corresponding to the boundary
        region;
        an inorganic pattern different from the plurality of
        inorganic layers, disposed in the opening and
        covering a region of the base layer exposed by the
        opening;
        an organic pattern disposed in the opening and on the
        inorganic pattern and contacting the inorganic
        pattern;
        an organic layer disposed on the plurality of inor-
        ganic layers and contacting an outermost inor-
        ganic layer of the plurality of inorganic layers
        farthest from the base layer;
        a light-emitting element disposed on the organic
        layer and in each of the plurality of pixel regions;
        and
        a transistor disposed between the base layer and the
        organic layer and electrically connected to the
        light-emitting element,
    wherein the opening is defined in each of the plurality
    of inorganic layers.

15. An electronic device comprising:
a display device comprising:
    a display module including a plurality of pixel regions
    and a boundary region, the display module compris-
    ing:
        a base layer overlapped with the plurality of pixel
        regions and the boundary region;
        a plurality of inorganic layers which are disposed on
        the base layer and in which an opening is defined
        at a position corresponding to the boundary
        region;
        an organic pattern different from the plurality of
        inorganic layers disposed in the opening;
        an inorganic pattern disposed on the organic pattern,
        contacting an outermost inorganic layer of the
        plurality of inorganic layers farthest from the base
        layer and sealing the organic pattern;
        an organic layer disposed on the plurality of inor-
        ganic layers and contacting the inorganic pattern
        and the outermost inorganic layer;

a light-emitting element disposed on the organic layer and in each of the plurality of pixel regions; and a transistor disposed between the base layer and the organic layer and electrically connected to the light-emitting element, wherein the opening is defined in each of the plurality of inorganic layers.

16. The electronic device of claim 15, wherein the base layer comprises a groove, which is defined at the position corresponding to the boundary region and is extended from the opening.

17. The electronic device of claim 16, wherein the organic pattern is further disposed in the groove.

18. The electronic device of claim 16, wherein the base layer comprises a first organic layer, a barrier inorganic layer disposed on the first organic layer, and a second organic layer disposed on the barrier inorganic layer, and the groove is defined in the second organic layer.

19. The electronic device of claim 15, further comprising a supporting member disposed below the display module, wherein the supporting member comprises a matrix layer and a plurality of supporting sticks, which are combined with the matrix layer, are extended in a first direction, and are arranged in a second direction crossing the first direction.

20. The electronic device of claim 15, wherein the display module is rollable by a roller.

\* \* \* \* \*